United States Patent
Yen et al.

(10) Patent No.: US 8,951,836 B2
(45) Date of Patent: Feb. 10, 2015

(54) CHIP PACKAGE AND METHOD FOR FORMING THE SAME

(71) Applicant: Xintec Inc., Jhongli, Taoyuan County (TW)

(72) Inventors: Yu-Lin Yen, Taipei (TW); Chien-Hui Chen, Zhongli (TW); Tsang-Yu Liu, Zhubei (TW); Long-Sheng Yeou, Hsinchu (TW)

(73) Assignee: Xintec, Inc., Jhongli (TW)

( * ) Notice: Subject to any disclaimer, the term of this patent is extended or adjusted under 35 U.S.C. 154(b) by 0 days.

(21) Appl. No.: 14/214,389

(22) Filed: Mar. 14, 2014

(65) Prior Publication Data

US 2014/0199835 A1    Jul. 17, 2014

Related U.S. Application Data

(60) Division of application No. 13/190,388, filed on Jul. 25, 2011, now Pat. No. 8,692,382, which is a continuation-in-part of application No. 13/044,457, filed on Mar. 9, 2011, now Pat. No. 8,525,345.

(60) Provisional application No. 61/315,850, filed on Mar. 19, 2010, provisional application No. 61/313,087, filed on Mar. 11, 2010.

(51) Int. Cl.
*H01L 21/44* (2006.01)
*H01L 21/768* (2006.01)
(Continued)

(52) U.S. Cl.
CPC .......... *H01L 21/76879* (2013.01); *B81B 7/007* (2013.01); *H01L 21/76898* (2013.01); *H01L 23/481* (2013.01); *H01L 23/49827* (2013.01);
*H01L 24/06* (2013.01); *H01L 24/94* (2013.01); *B81B 2207/07* (2013.01);
(Continued)

(58) Field of Classification Search
CPC ................. H01L 2924/00; H01L 2924/00014; H01L 2224/32225; H01L 2224/73265; H01L 2224/48091
USPC .................................. 438/106, 612; 257/774
See application file for complete search history.

(56) References Cited

U.S. PATENT DOCUMENTS 5,229,647 A    7/1993   Gnadinger
7,425,499 B2   9/2008   Oliver et al.
(Continued)

FOREIGN PATENT DOCUMENTS

CN    101221939    7/2008
CN    101355069    1/2009
(Continued)

*Primary Examiner* — Andy Huynh
(74) *Attorney, Agent, or Firm* — Liu & Liu

(57) ABSTRACT

A method for forming a chip package, in which a substrate has a plurality of conducting pads located below its lower surface, and a dielectric layer located between the conducting pads. A hole is formed extending from the upper surface of the substrate towards the conducting pads. After the hole is formed, a trench is formed extending from the upper surface towards the lower surface of the substrate, with the trench connecting with the hole. An insulating layer is formed on a sidewall of the trench and a sidewall and a bottom of the hole, and a portion of the insulating layer and a portion of the dielectric layer are removed to expose a portion of the conducting pads. A conducting layer is formed on the sidewall of the trench and the sidewall and the bottom of the hole, electrically contacting with the conducting pads.

20 Claims, 28 Drawing Sheets

(51) Int. Cl.
*B81B 7/00* (2006.01)
*H01L 23/48* (2006.01)
*H01L 23/498* (2006.01)
*H01L 23/00* (2006.01)
H01L 23/31 (2006.01)
H01L 25/065 (2006.01)

(52) U.S. Cl.
CPC ...... *B81B 2207/092* (2013.01); *H01L 23/3178* (2013.01); *H01L 24/13* (2013.01); *H01L 24/32* (2013.01); *H01L 25/0657* (2013.01); *H01L 2221/68377* (2013.01); *H01L 2224/05553* (2013.01); *H01L 2224/0557* (2013.01); *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2924/01013* (2013.01); *H01L 2924/01014* (2013.01); *H01L 2924/01029* (2013.01); *H01L 2924/01078* (2013.01); *H01L 2924/01079* (2013.01); *H01L 2924/014* (2013.01); *H01L 2924/10253* (2013.01); *H01L 2924/14* (2013.01); *H01L 2924/01021* (2013.01); *H01L 2924/01033* (2013.01); *H01L 2224/13025* (2013.01); *H01L 2224/9202* (2013.01)
USPC ............... 438/106; 438/612; 257/774

(56) References Cited

U.S. PATENT DOCUMENTS

| | | | |
|---|---|---|---|
| 7,786,584 | B2 | 8/2010 | Barth et al. |
| 2006/0121719 | A1* | 6/2006 | Nakamura et al. ............ 438/613 |
| 2009/0194886 | A1* | 8/2009 | Hiatt ............................. 257/774 |
| 2010/0109164 | A1 | 5/2010 | Kang et al. |
| 2011/0169159 | A1* | 7/2011 | Lin et al. ....................... 257/692 |

FOREIGN PATENT DOCUMENTS

| | | |
|---|---|---|
| CN | 101587886 | 11/2009 |
| CN | 101599477 | 12/2009 |
| CN | 101740476 | 6/2010 |
| CN | 103295985 | 9/2013 |
| TW | 200950040 | 12/2009 |
| TW | 201125097 | 7/2011 |

* cited by examiner

CHIP PACKAGE AND METHOD FOR FORMING THE SAME

CROSS REFERENCE

This application is a Divisional of U.S. application Ser. No. 13/190,388, filed on Jul. 25, 2011, which is a Continuation-In-Part of pending U.S. patent application Ser. No. 13/044,457, filed Mar. 9, 2011, now U.S. Pat. No. 8,525,345, and entitled "Chip package and method for forming the same", which claims the benefit of U.S. Provisional Application No. 61/313,087, filed on Mar. 11, 2010 and claims the benefit of U.S. Provisional Application No. 61/315,850, filed on Mar. 19, 2010, the entirety of which are incorporated by reference herein.

BACKGROUND OF THE INVENTION

1. Field of the Invention

The present invention relates to a chip package, and in particular relates to a chip package having a through-substrate via (through-substrate via, TSV).

2. Description of the Related Art

Recently, through-substrate vias are frequently being formed in a chip packages to accommodate miniaturization and multi-functionality requirements of chips. In order to further improve the functionality of the chip, conducting routes to the through-substrate vias need to be improved, such that high density conducting routes may be achieved even if the size of the chip package continues to shrink. In addition, it is desired to improve the structural reliability of the through-substrate via.

BRIEF SUMMARY OF THE INVENTION

According to an embodiment of the invention, a chip package is provided. The chip package includes: a substrate having an upper surface and a lower surface; a plurality of conducting pads located under the lower surface of the substrate; a dielectric layer located between the conducting pads; a trench extending from the upper surface towards the lower surface of the substrate; a hole extending from a bottom of the trench towards the lower surface of the substrate, wherein an upper sidewall of the hole inclines to the lower surface of the substrate, and a lower sidewall or a bottom of the hole exposes a portion of the conducting pads; and a conducting layer located in the hole and electrically connected to at least one of the conducting pads.

According to an embodiment of the invention, a method for forming a chip package is provided. The method includes: providing a substrate having an upper surface and a lower surface, wherein the substrate comprises: a plurality of conducting pads located below the lower surface of the substrate; and a dielectric layer located between the conducting pads; removing a portion of the substrate from the upper surface of the substrate to form a hole extending towards the conducting pads; after the hole is formed, removing a portion of the substrate from the upper surface of the substrate to form a trench extending towards the lower surface of the substrate, wherein the trench connects with the hole; forming an insulating layer on a sidewall of the trench and a sidewall and a bottom of the hole; removing a portion of the insulating layer and a portion of the dielectric layer to expose a portion of the conducting pads; and forming a conducting layer on the sidewall of the trench and the sidewall and the bottom of the hole, wherein the conducting layer electrically contacts with the conducting pads.

According to an embodiment of the invention, a method for forming a chip package is provided. The method includes: providing a substrate having a first surface and a second surface, wherein the substrate comprises: a plurality of conducting pads located on the first surface of the substrate; and a dielectric layer located between the conducting pads; disposing a carrier substrate on the conducting pads and the dielectric layer on the first surface of the substrate; removing a portion of the carrier substrate from an upper surface of the carrier substrate to form a hole extending towards the conducting pads; after the hole is formed, removing a portion of the carrier substrate from the upper surface of the carrier substrate to form a trench extending towards the substrate, wherein the trench connects with the hole; forming an insulating layer on the sidewall of the trench and the sidewall and the bottom of the hole; removing a portion of the insulating layer and a portion of the dielectric layer to expose a portion of the conducting pads; and forming a conducting layer on the sidewall of the trench and the sidewall and the bottom of the hole, wherein the conducting layer electrically contacts with the conducting pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. Note that the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

A chip package according to an embodiment of the present invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. Note that the above mentioned wafer scale package process may also be adapted to form chip packages of multi-layer integrated circuit devices by stacking a plurality of wafers having integrated circuits.

In a chip package according to embodiments of the invention, each pattern of the multi-layered conducting pads is designed such that a through-substrate conducting structure formed in the package may electrically contact with the multi-layered conducting pads, improving the structural reliability of the chip package and increasing conducting routes connected to the through-substrate conducting structure.

Figure 1A:
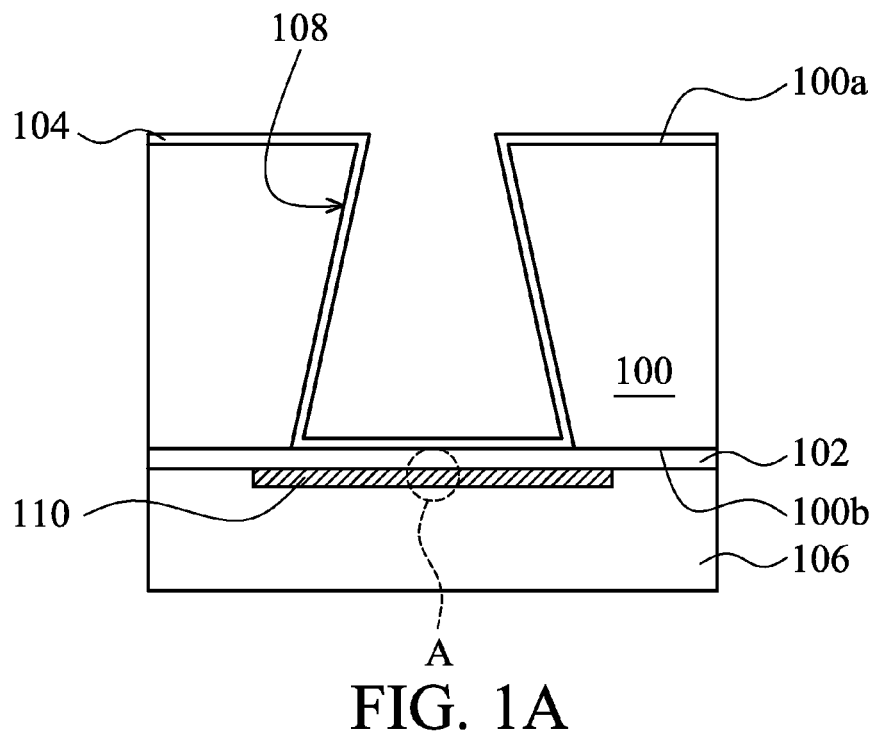
FIGS. 1A-1C are cross-sectional views showing the steps of forming a chip package according to an embodiment of the present invention.
Figure 1B:
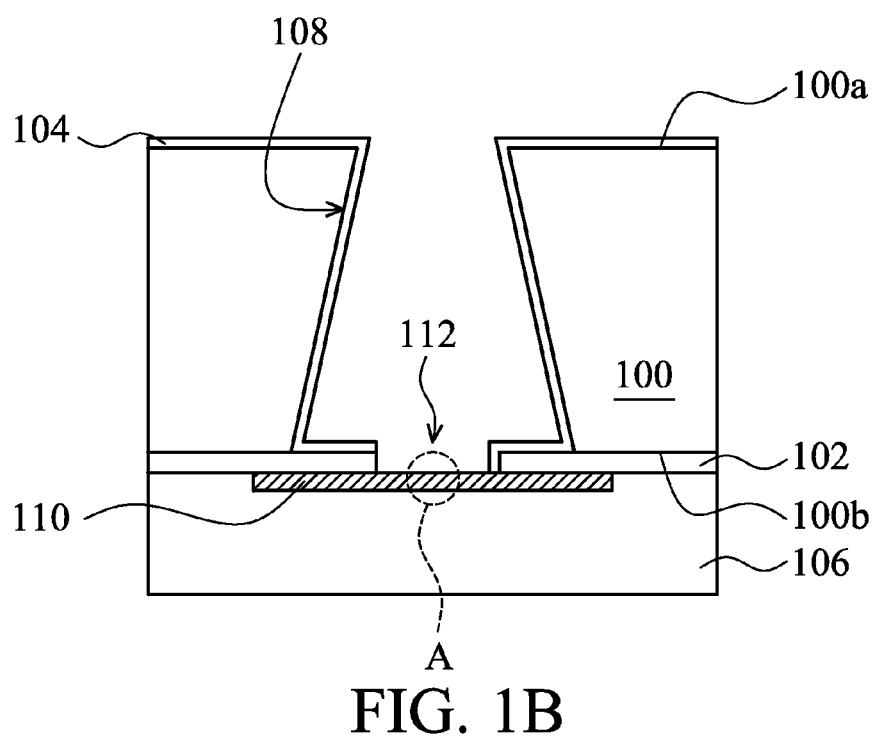
Figure 1C:
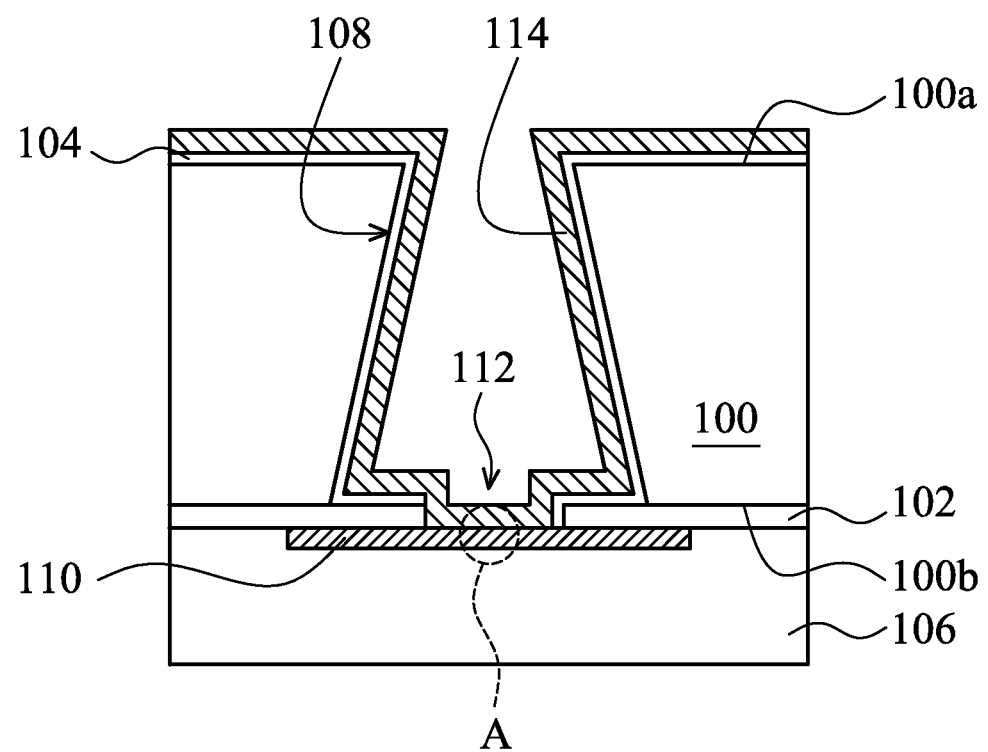

FIGS. 1A-1C are cross-sectional views showing the steps of forming a chip package according to an embodiment of the present invention. As shown in FIG. 1A, a substrate is provided, which includes an upper surface 100a and a lower surface 100b. The substrate 100 may include, for example, a semiconductor material or a ceramic material. In one embodiment, the substrate 100 may be a semiconductor wafer (such as a silicon wafer) which benefits performing of a wafer-level package process. Adopting a wafer-level package process to form a chip package may reduce fabrication cost and time.

In one embodiment, the substrate 100 includes a conducting pad structure 110 which is located under the lower surface 100b of the substrate 100. However, in another embodiment, the conducting pad structure 110 may be located in the substrate 100. The conducting pad structure 110 is a stacked structure of a plurality of conducting pads, such as a plurality of conducting pads having dielectric layers interposed therebetween. The structure of the conducting pad structure 110 will be illustrated in detail with references made to FIGS. 2A-2C which are enlarged cross-sectional views showing the steps of forming a chip package according to an embodiment of the invention. In the embodiment shown in FIG. 1A, the conducting pad structure 110 is located below the lower surface 100b of the substrate 100 and separated from the lower surface 100b of the substrate 100 by an insulating layer 102. In addition, a substrate 106 may be disposed under the substrate 100 and the conducting pad structure 110. The substrate 106 may include, for example, an insulating material. In one embodiment, the substrate 106 may be a spacer layer disposed on a glass substrate.

Figure 2A:
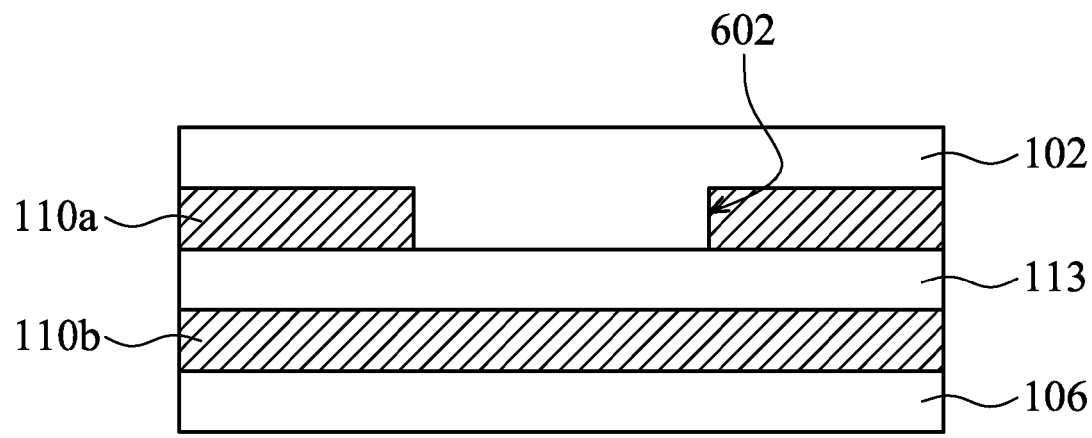
FIGS. 2A-2C are enlarged cross-sectional views showing the steps of forming a chip package according to an embodiment of the present invention.

Referring to FIG. 2A, an enlarged cross-sectional view showing the area A of the embodiment in FIG. 1A is illustrated. A conducting pad 110b, a dielectric layer 113, a conducting pad 110a, and the insulating layer 102 are formed on the substrate 106. In one embodiment, a pattern of the conducting pad 110a is designed such that a portion of the conducting pad 110b thereunder is exposed. In one embodiment, the conducting pad 110a has at least an opening (or a trench) 602. The opening 602 exposes the dielectric layer 113 and the conducting pad 110b directly below the opening. That is, in this embodiment, an upper conducting pad (110a) has at least an opening (or a trench) which exposes a lower conducting pad (110b). It should be appreciated that "exposed" herein does not mean that the conducting pad 110 can be seen and means that the opening 602 overlaps with a portion of the conducting pad 110b directly below the opening.

Next, a hole is formed in the substrate 100. The hole extends from the upper surface 100a towards the lower surface 100b of the substrate 100, and the hole exposes a portion of the conducting pad 110a and a portion of the conducting pad 110b. In one embodiment, the hole is formed in a single etching process. In another embodiment, the hole is stepwise formed. Hereafter, examples are provided to illustrate the procedure of stepwise forming the hole exposing a portion of the conducting pad 110a and a portion of the conducting pad 110b.

For example, referring to FIG. 1A, in this embodiment, a first hole 108 is formed from the upper surface 100a of the substrate 100. The first hole 108 extends towards the conducting pad structure 110 (i.e., extends towards the conducting pad 110a). Take the embodiment of FIG. 1A as an example, the first hole 108 penetrates the substrate 100 and stops at the insulating layer 102 between the substrate 100 and the conducting pad structure 110. Then, an insulating layer 104 may be optionally formed on a sidewall and a bottom of the first hole 108 to electrically isolate the substrate 100 and a conducting layer, which is subsequently formed in the hole.

Figure 2B:
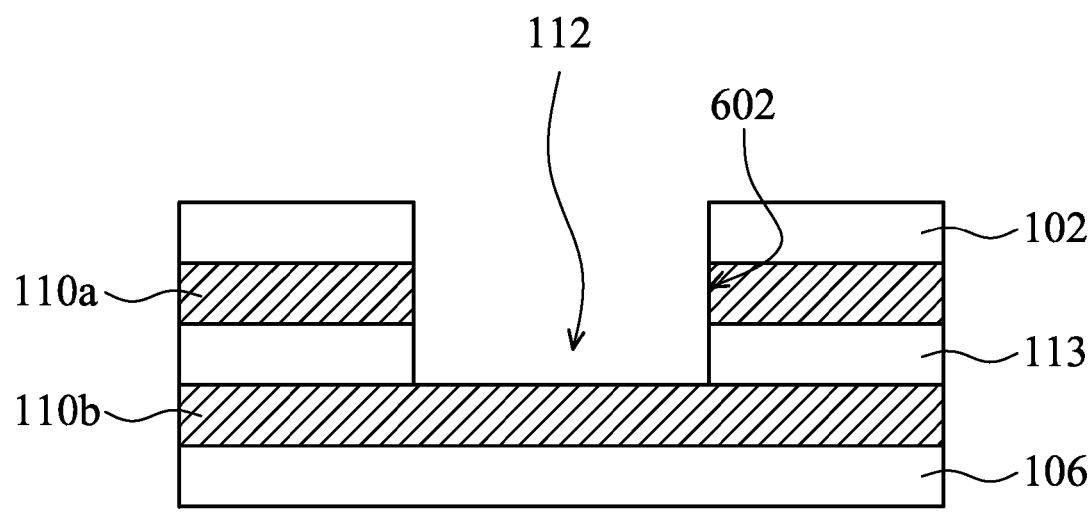

Next, as shown in FIG. 1B, a second hole 112 is formed from the bottom of the first hole 108. That is, portions of the insulating layers 104 and 102 are removed such that the conducting pad structure 110 thereunder is exposed. Note that the second hole 112 further exposes the conducting pads 110a and 110b. Referring to FIG. 2B, an enlarged cross-sectional view showing the area A of the embodiment of FIG. 1B is illustrated.

As shown in FIGS. 2A and 2B, the formation step of the second hole 112 includes removing the insulating layer 102 in the opening 602 of the conducting pad 110a and a portion of the dielectric layer 113 thereunder. In one embodiment, a sidewall of the formed second hole 112 exposes a portion of the conducting pad 110a. For example, a side of the conducting pad 110a is exposed, as shown in FIG. 2B. In one embodiment, a bottom of the formed second hole 112 exposes a portion of the conducting pad 110b. For example, an upper surface of the conducting pad 110b is exposed, as shown in FIG. 2B. Because only an insulating material is removed during the formation of the hole 112, the hole may be formed in a single etching process. Note that the etching rate of the chosen etchant for the dielectric material or insulating material is preferably higher than that for the metal material or conducting material.

As mentioned above, the pattern of the conducting pad 110a is designed to expose a portion of the conducting pad 110b thereunder. Thus, during the formation of the second hole 112, the materials which are removed are substantially the insulating material in the opening 602 of the conducting pad 110a and the dielectric material thereunder. The second hole 112 may be therefore formed in a single etching process.

Figure 6A:
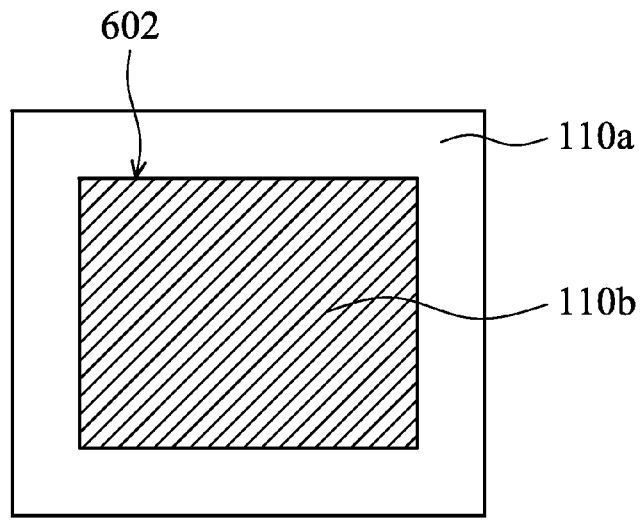
FIGS. 6A-6E are top views partially showing chip packages according to embodiments of the present invention.

FIG. 6A is a top view partially showing a chip package according to an embodiment of the present invention, which merely shows a relationship between the conducting pads 110a and 110b. It should be appreciated that the top view shown in FIG. 6A is only used to illustrate a specific example, but not used to limit embodiments of the present invention. As shown in FIG. 6A, the conducting pad 110a has at least an opening 602 which exposes the conducting pad 110b thereunder. That is, the conducting pads 110a and 110b with different depths are exposed in the second hole 112.

Figure 2C:
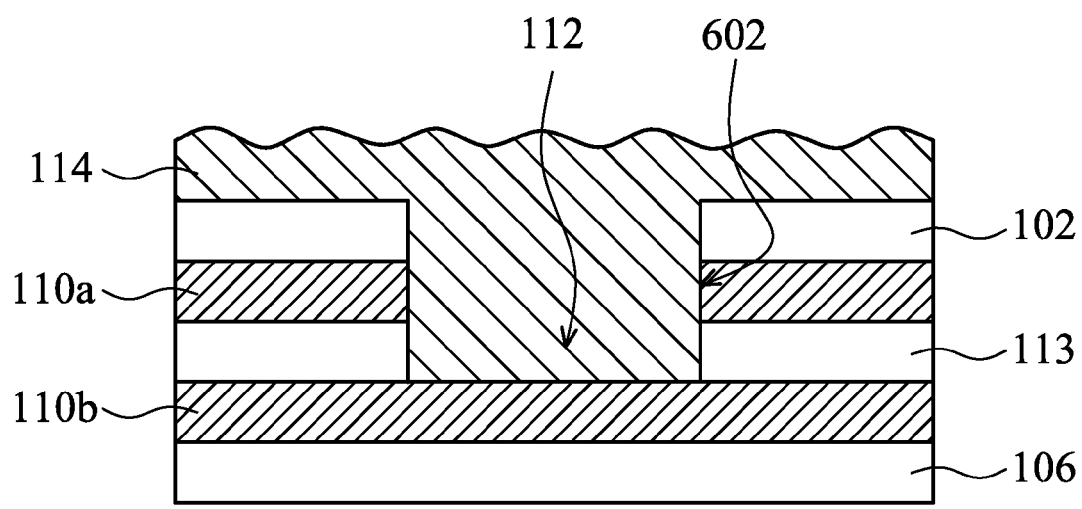

Next, referring to FIG. 1C, a conducting layer 114 is formed in a hole formed by the first hole 108 and the second hole 112. Referring to FIG. 2C, an enlarged cross-sectional view showing the area A of the embodiment in FIG. 1C is illustrated. As shown in FIG. 2C, the conducting layer 114 extends into the second hole 112 and electrically contacts with the conducting pad 110a and the conducting pad 110b. In one embodiment, the conducting layer 114 may be fixed in the second hole 112 for a better structural stability. The conducting layer 114 simultaneously contacts with the conducting pad 110a and the conducting pad 110b such that the conducting layer 114 may be connected to more conducting routes. In one embodiment, the conducting pad 110a and the conducting pad 110b are connected to a same electronic device. Because the conducting layer 114 simultaneously and electrically contacts with the conducting pad 110a and the conducting pad 110b, a short of the conducting routes connected to the electronic device may be ensured from occurring. In another embodiment, the conducting pad 110a and the conducting pad 110b are connected to different electronic devices, respectively. The different electronic devices may transmit or receive electrical signals through the conducting layer 114 and the conducting pad 110a and the conducting pad 110b, respectively.

Figure 3A:
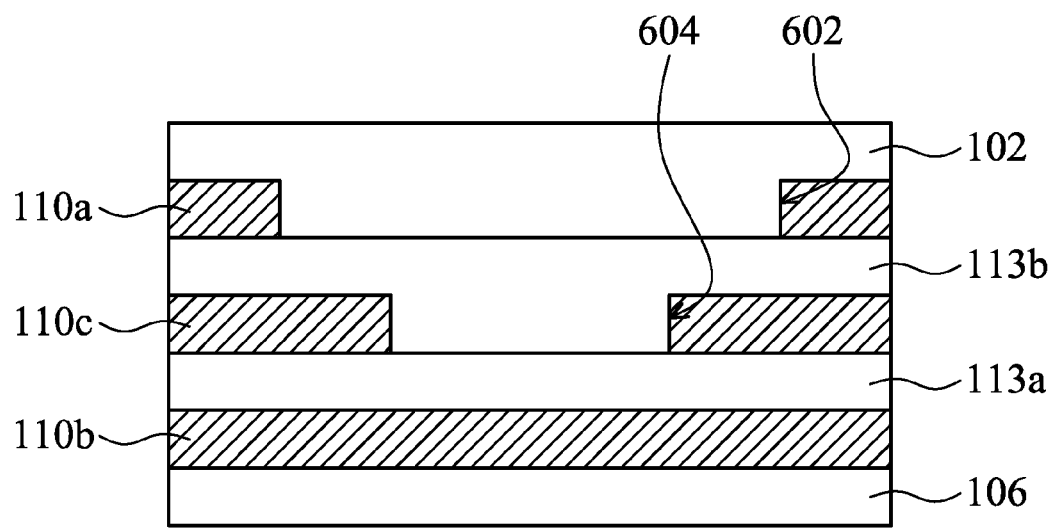
FIGS. 3A-3C are enlarged cross-sectional views showing the steps of forming a chip package according to an embodiment of the present invention.
Figure 3B:
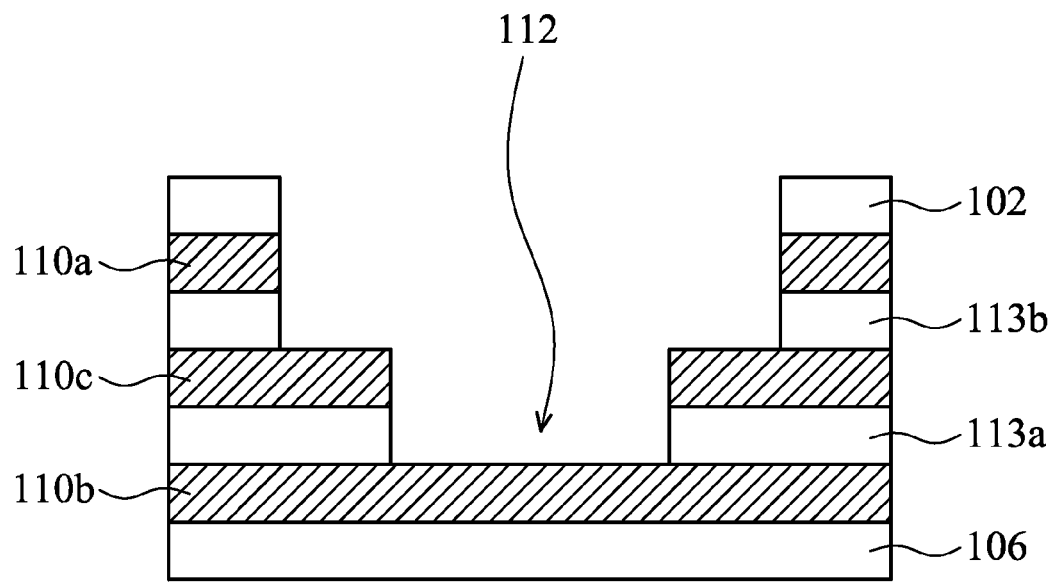
Figure 3C:
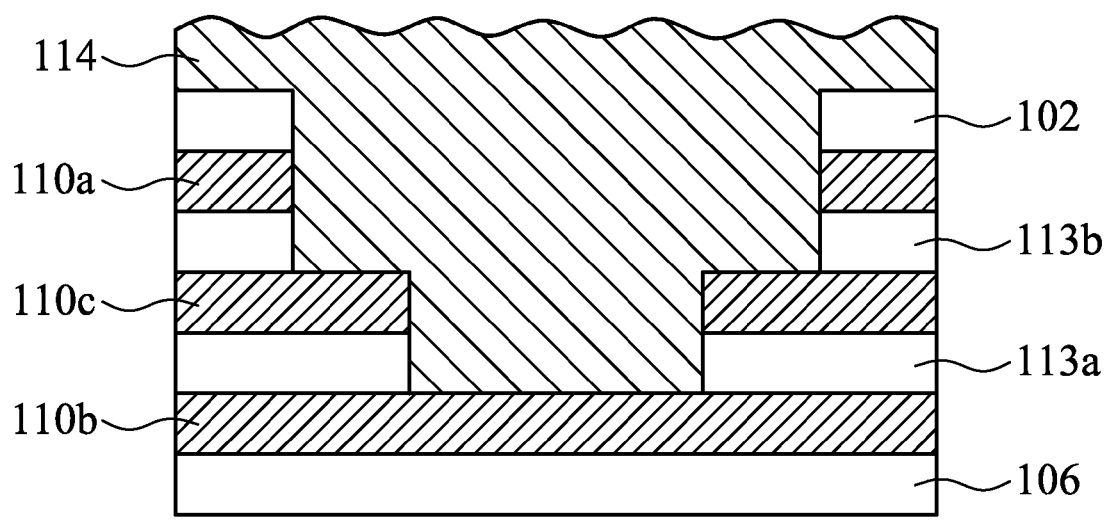

The conducting pad structure 110 according to embodiments of the invention includes not only two conducting pads (110a, 110b), but may further include another conducting pad. FIGS. 3A-3C are enlarged cross-sectional views showing the steps of forming a chip package according to another embodiment of the present invention, wherein same or similar reference numbers are used to designate same or similar elements. Note that because the main difference between the embodiment shown in FIG. 3 and the embodiment shown in FIG. 2 is the design of the conducting pad structure 110, reference may be made to the descriptions corresponding to FIGS. 1A-1C concerning the fabrication method of the embodiment shown in FIG. 3. Thus, repeated descriptions are not provided.

As shown in FIG. 3A, in one embodiment, the chip package includes the conducting pad 110a and the conducting pad 110b and further includes a conducting pad 110c which is located in a dielectric layer between the conducting pads 110a and 110b. As shown in FIG. 3A, the conducting pad 110b, a dielectric layer 113a, the conducting pad 110c, a dielectric layer 113b, the conducting pad 110a, and the insulating layer 102 are formed on the substrate 106. In one embodiment, a pattern of the conducting pad 110a is designed to expose a portion of the conducting pad 110c thereunder and a portion of the conducting pad 110b. In one embodiment, the conducting pad 110a has at least an opening (or a trench) 602. The opening 602 exposes the dielectric layer 113b, the conducting pad 110c thereunder, the dielectric layer 113a, and the conducting pad 110b thereunder. In addition, a pattern of the conducting pad 110c is also designed to have at least an opening (or a trench). The opening 604 exposes the dielectric layer 113a and the conducting pad 110b thereunder.

In other words, a chip package according to an embodiment of the present invention includes a plurality of conducting pads (such as the conducting pads 110a, 110c, 110b), wherein an upper conducting pad of the conducting pads has at least an opening or a trench exposing a lower conducting pad of the conducting pads. For example, the conducting pad 110a (the upper conducting pad) has the opening 602 exposing the conducting pads 110c and 110b (the lower conducting pads). Similarly, the conducting pad 110c (the upper conducting pad) has the opening 604 exposing the conducting pad 110b (the lower conducting pad).

Then, a hole is formed in the substrate 100. The hole extends from the upper surface 100a towards the lower surface 100b of the substrate 100. The hole exposes a portion of the conducting pad 110a, a portion of the conducting pad 110c, and a portion of the conducting pad 110c. In one embodiment, the hole is formed in a single etching process. In another embodiment, the hole is stepwise formed.

Similarly, in this embodiment, the first hole 108 may also be first formed (as shown in FIG. 1A), and the second hole 112 is then formed at the bottom of the first hole 108, as shown in FIG. 1B. FIG. 3B are an enlarged cross-sectional view showing the structure near the second hole 112.

Similarly, during the formation of the second hole 112, the material which is removed is substantially the insulating material in the opening 602 and the dielectric material thereunder. Thus, the second hole 112 may be formed in a single etching process.

Figure 6B:
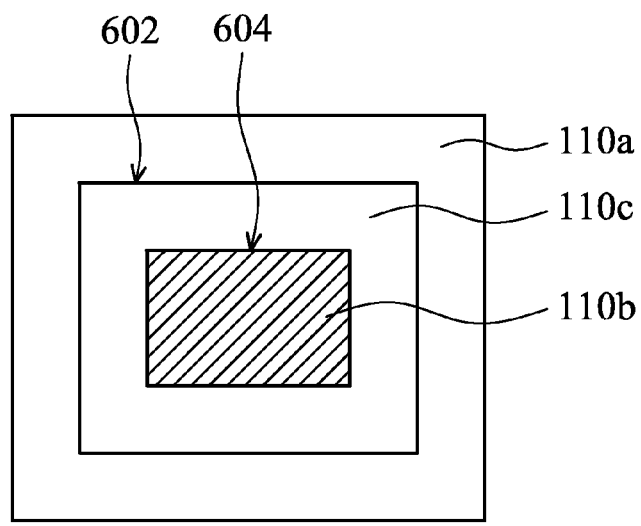

FIG. 6B is a top view partially showing a chip package according to an embodiment of the present invention, which merely shows a relationship between the conducting pads 110a, 110b, and 110c. It should be appreciated that the top view shown in FIG. 6B is only used to illustrate a specific example, but not used to limit embodiments of the present invention. As shown in FIG. 6B, the conducting pad 110a has at least an opening 602 which exposes the conducting pads 110c and 110b thereunder. In addition, the conducting pad 110c has at least an opening 604 which exposes the conducting pad 110b thereunder. That is, the conducting pads 110a, 110c, and 110b with different depths are exposed in the second hole 112.

Similarly, as shown in FIG. 3C, the conducting layer 114 is then formed, which extends into the second hole 112 to electrically contact with the conducting pads 110a, 110c, and 110b. In one embodiment, the conducting layer 114 may be fixed in the second hole 112 for a better structural stability.

The conducting layer 114 simultaneously contacts with the conducting pads 110a, 110c, and 110b, which may be connected to more conducting routes.

As mentioned above, through the design of the pattern of the conducting pad, a hole simultaneously exposing a plurality of conducting pads may be formed in a single etching process, increasing the number of conducting routes which are electrically connected to by the conducting layer to be formed in the hole (the through substrate conducting structure). Note that because the surface profile of the formed hole is relatively rough (because of the plurality of conducting pads with different depths), the adhesion between the conducting layer and the sidewall of the hole may be improved, thus increasing the structural stability of the through substrate conducting structure.

Figure 6C:
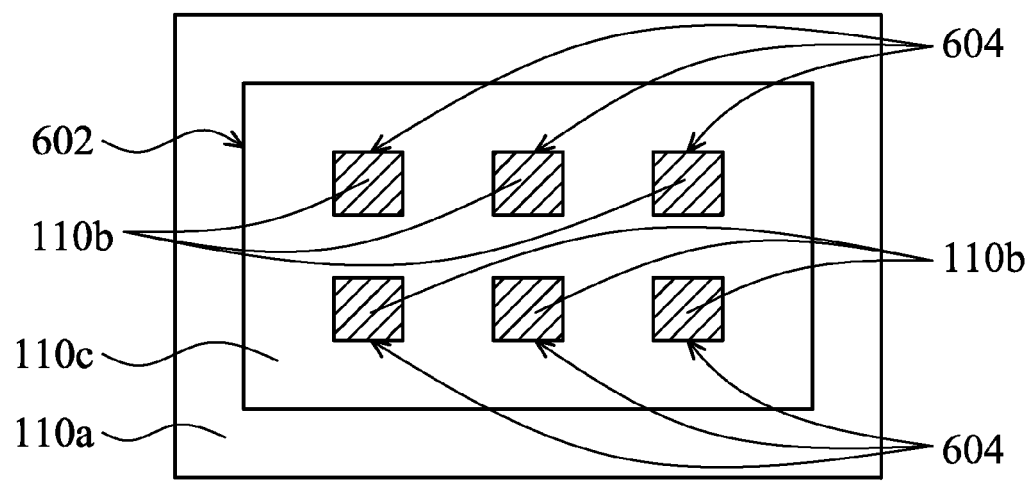
Figure 6D:
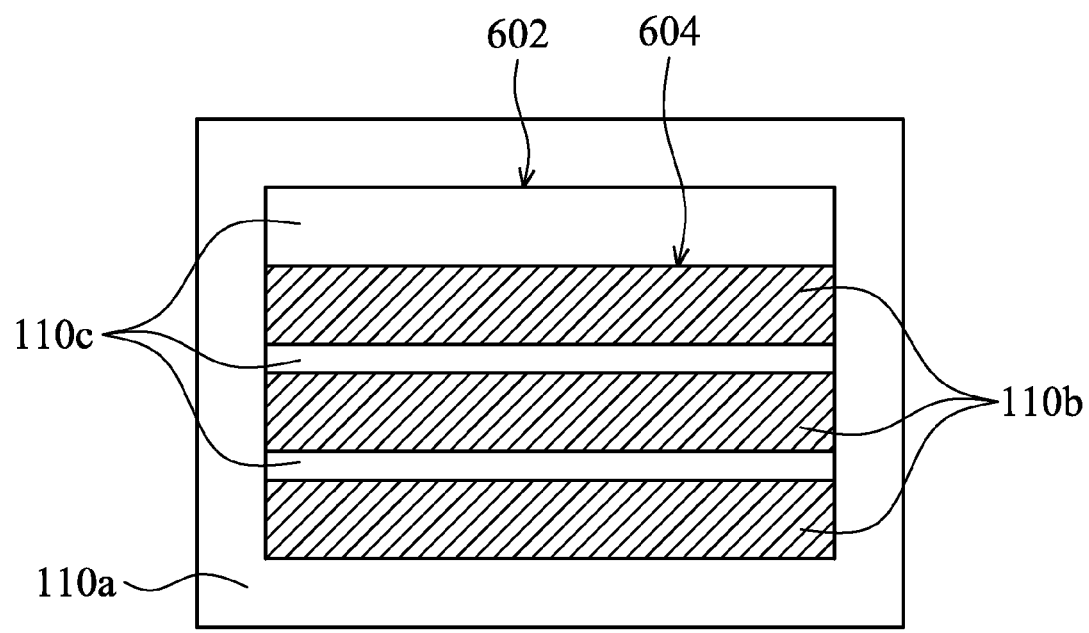
Figure 6E:
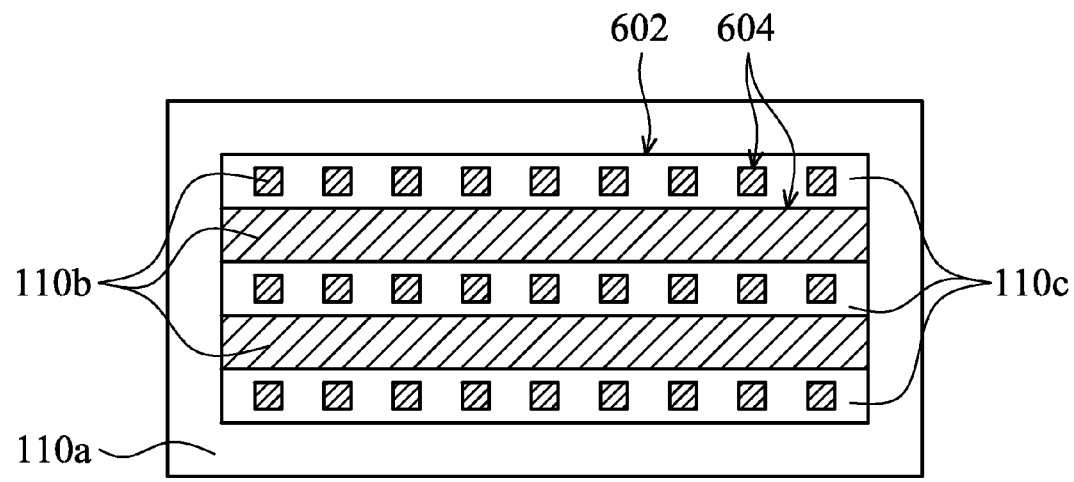

It should be appreciated that the design of the pattern of the conducting pad may have a variety of types and is not limited to those shown in FIGS. 6A-6B. FIGS. 6C-6E are top views partially showing chip packages according to embodiments of the present invention. Similarly, FIGS. 6C-6E are only used to illustrate examples, but not used to limit embodiments of the present invention.

As shown in FIG. 6C, in one embodiment, the conducting pad 110a has a rectangular opening 602 which exposes the conducting pads 110c and 110b thereunder. The conducting pad 110c has a plurality of rectangular openings 604 which expose the conducting pad 110b thereunder.

As shown in FIG. 6D, in another embodiment, the conducting pad 110a has a rectangular opening 602 which exposes the conducting pads 110c and 110b thereunder. The conducting pad 110c has a plurality of rectangular openings 604 (or trenches) which expose the conducting pad 110b thereunder.

As shown in FIG. 6E, in yet another embodiment, the conducting pad 110a has a rectangular opening 602 which exposes the conducting pads 110c and 110b thereunder. The conducting pad 110c has a plurality of openings 604 including square openings and rectangular openings (or trenches) which expose the conducting pad 110b thereunder. As mentioned above, the shapes, numbers, and distributions of the openings of the conducting pad may be adjusted according to requirements.

Figure 4A:
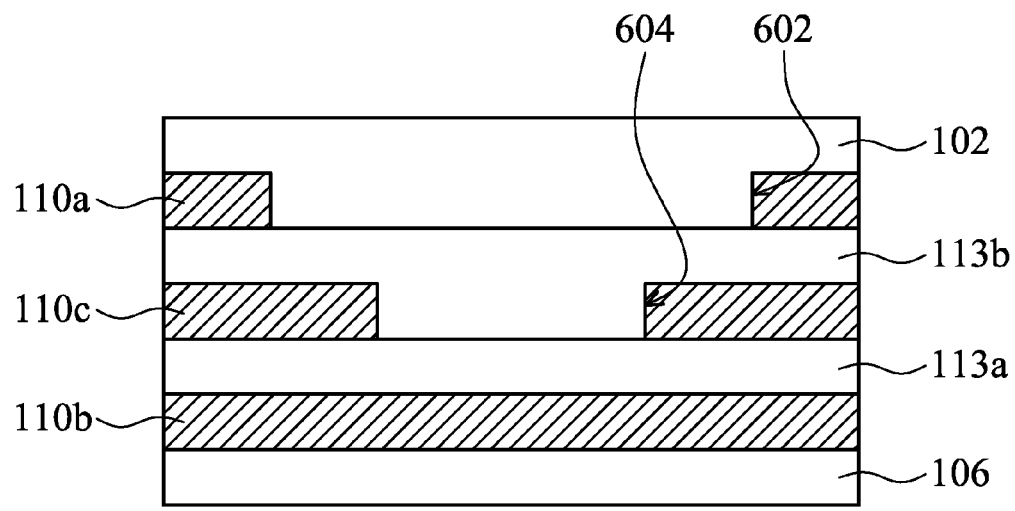
FIGS. 4A-4B are enlarged cross-sectional views showing the steps of forming a chip package according to an embodiment of the present invention.
Figure 4B:
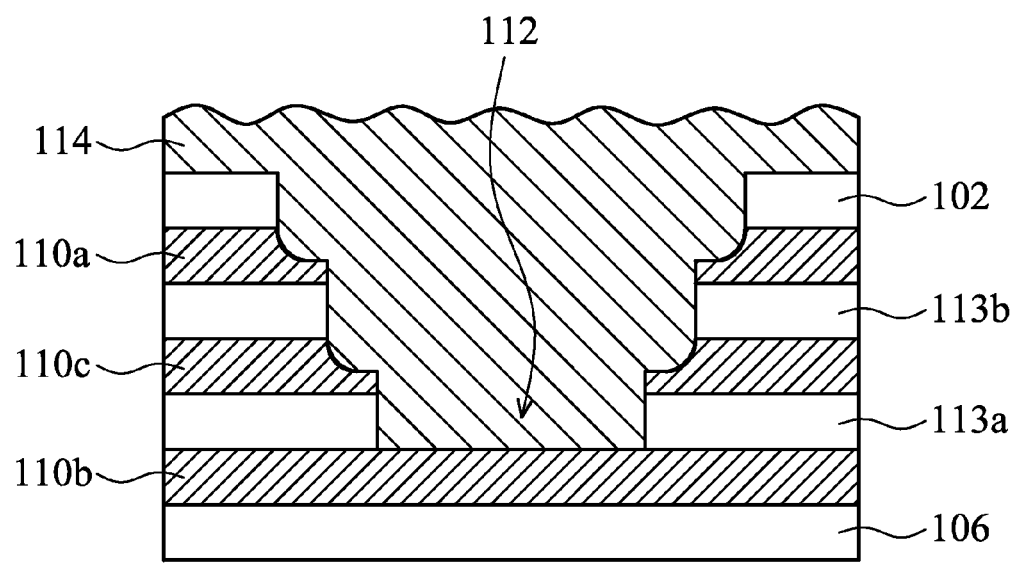

FIGS. 4A-4B are enlarged cross-sectional views showing the steps of forming a chip package according to an embodiment of the present invention, wherein same or similar reference numbers are used to designate same or similar elements, and the structure shown in FIG. 4A is similar to that shown in FIG. 3A, and the main difference is shown in FIG. 4B.

As mentioned above, the formation of the second hole 112 includes using a single etching process. In one situation, during the etching process to form the second hole 112, the conducting pad beside the hole may be partially removed. As shown in FIG. 4B, portions of the conducting pads 110a and 110c may also be etched and removed during the formation of the second hole 112. In this situation, the thickness of the portion of the conducting pad 110a near the hole 112 increases along a direction away from the hole 112. Similarly, in one embodiment, the thickness of the portion of the conducting pad 110c near the hole 112 increases along a direction away from the hole 112. When the conducting layer 114 is subsequently formed in the second hole 112, the conducting layer 114 may still electrically contact with the conducting pads 110a, 110c, and 110b. Note that because portions of the conducting pads 110a and 110c are removed, the contact area between the conducting layer 114 and the conducting pads 110a and 110c is therefore increased, as shown in FIG. 4B.

Figure 5:
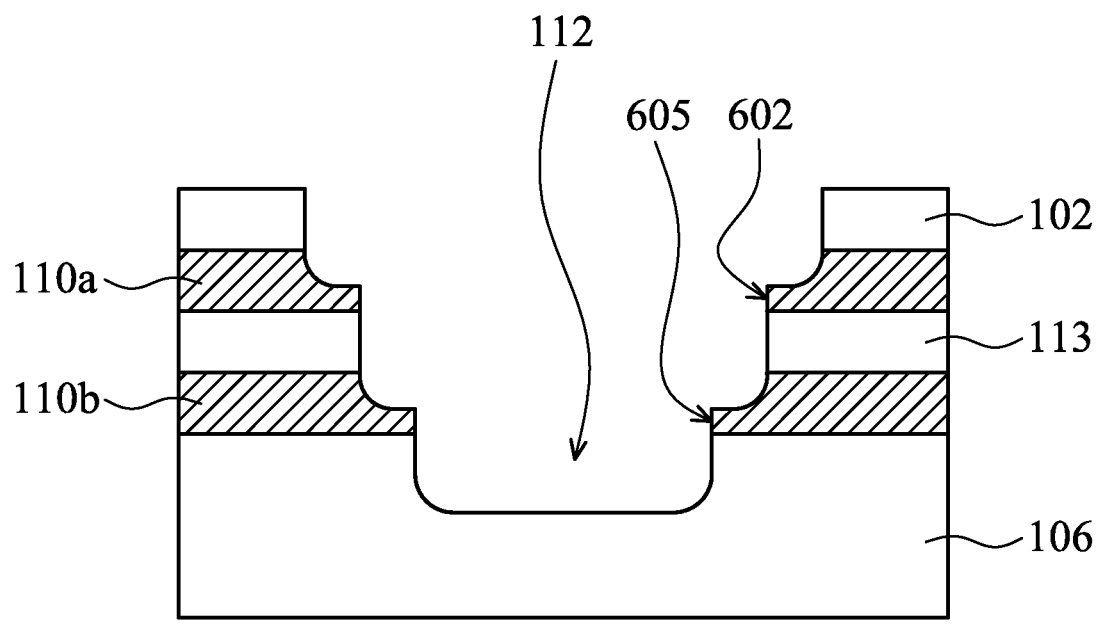
FIG. 5 is an enlarged cross-sectional view partially showing a chip package according to an embodiment of the present invention.

FIG. 5 is an enlarged cross-sectional view partially showing a chip package according to an embodiment of the present invention. Similarly, in this embodiment, portions of the conducting pads 110a and 110b are removed during the formation of the second hole 112. In this situation, the thickness of the portion of the conducting pad 110a near the hole 112 increases along a direction away from the hole 112. Similarly, the thickness of the portion of the conducting pad 110b near the hole 112 increases along a direction away from the hole 112. In addition, in this embodiment, the conducting pad 110b is designed to have an opening 605 which exposes the substrate 106 thereunder. In one embodiment, the second hole 112 may further extend into the substrate 106. For example, in one embodiment, the second hole 112 may extend into a spacer layer of the substrate 106.

Figure 7:
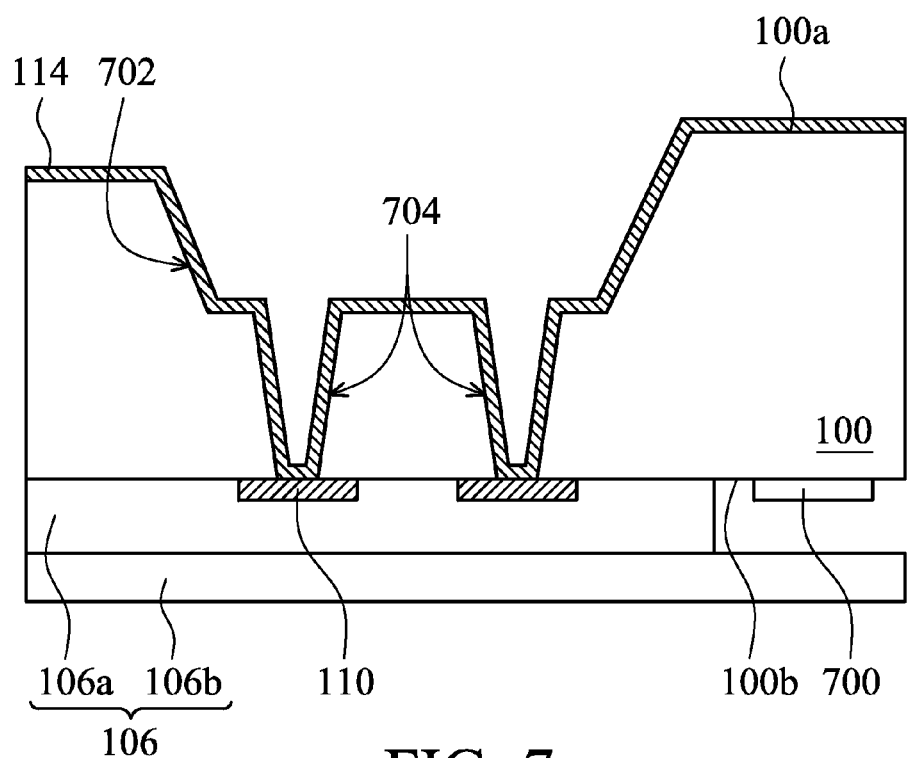
FIG. 7 is a cross-sectional view showing a chip package according to an embodiment of the present invention.

FIG. 7 is a cross-sectional view showing a chip package according to an embodiment of the present invention, wherein same or similar reference numbers are used to designate same or similar elements. In this embodiment, the chip package further includes a trench 702 which extends from the upper surface 100a towards the lower surface 100b of the substrate 100. A plurality of contact holes 704 are formed at the bottom of the trench 702. The contact hole 704 exposes the conducting pad structure 110 under the substrate 100. The conducting layer 114 may extend to the conducting pad structure along the upper surface 100a of the substrate 100, the sidewall of the trench 702, and the sidewall of the contact hole 704, and the conducting pad structure 110 may be similar to the embodiments mentioned above and include a plurality of conducting pads having specifically designed patterns. The conducting layer 114 may extend along the sidewalls of the formed holes to electrically contact with the conducting pads. In addition, in this embodiment, the substrate 100 may include a transparent substrate 106b and a spacer layer 106a disposed thereon. The spacer layer 106a, the substrate 100, and the transparent substrate 106b may surround a cavity. A chip 700 may be disposed in the cavity, which may be, for example, (but is not limited to) a light sensing chip or a light emitting chip.

In a chip package according to embodiments of the invention, each pattern of the multi-layered conducting pads is designed such that a through-substrate conducting structure formed in the package may electrically contact with the multi-layered conducting pads, improving the structural reliability of the chip package and increasing conducting routes connected to the through-substrate conducting structure.

Figure 8:
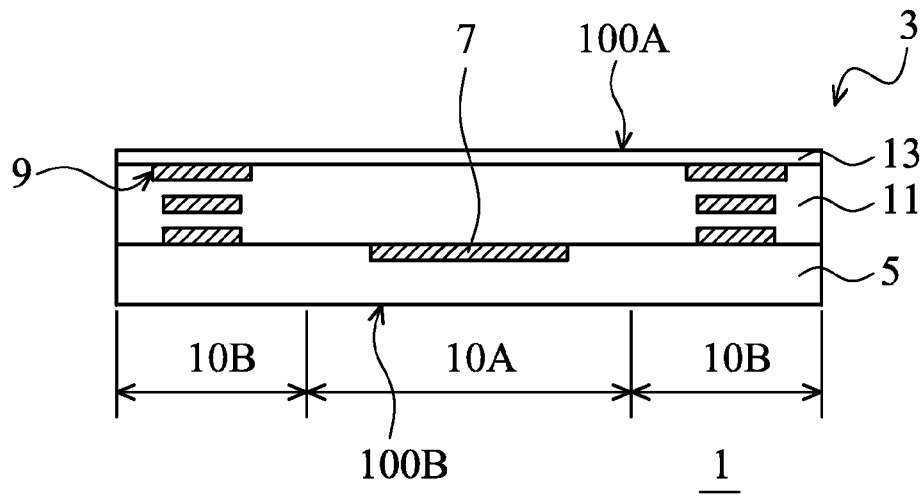
FIGS. 8-13 are cross-sectional views showing the steps of forming a chip package according to an embodiment of the present invention.

FIGS. 8-13 are cross-sectional views showing the steps of forming a chip package according to an embodiment of the present invention. As shown in FIG. 8, a wafer 1 is provided, which includes a plurality of chips 3 such as a CMOS image sensor chip. The chip includes a substrate 5, wherein an active region 10A and peripheral circuit regions 10B are defined. The chip 3 has a front surface 100a and a back surface 100b. An image sensor device 7 and a conducting pad structure 9 are disposed on the front surface 100a in the active region 10A and the peripheral circuit region 10B, respectively. The substrate 5 includes, for example, a semiconductor material or a ceramic material. In one embodiment, the substrate 5 is a semiconductor wafer (such as a silicon wafer) which is suitable for a wafer-level packaging process. Adopting a wafer-level packaging process to form chip packages may reduce fabrication cost and fabrication time.

In one embodiment, the conducting pad structure 9 may be constructed by a metal layer or a stacked structure composed by a plurality of conducting pads such as a plurality of conducting pads having a dielectric layer 11 interposed therebetween. The detailed structure of the conducting pad structure 9 will be illustrated in company with the following embodiments. Typically, a chip passivation layer 13, such as an oxide layer, nitride layer, or composite layer, is covered on the front surface of the chip. An opening may be optionally formed in the chip passivation layer 13 on the position above the conducting pad structure, depending on the packaging process type.

Figure 9:
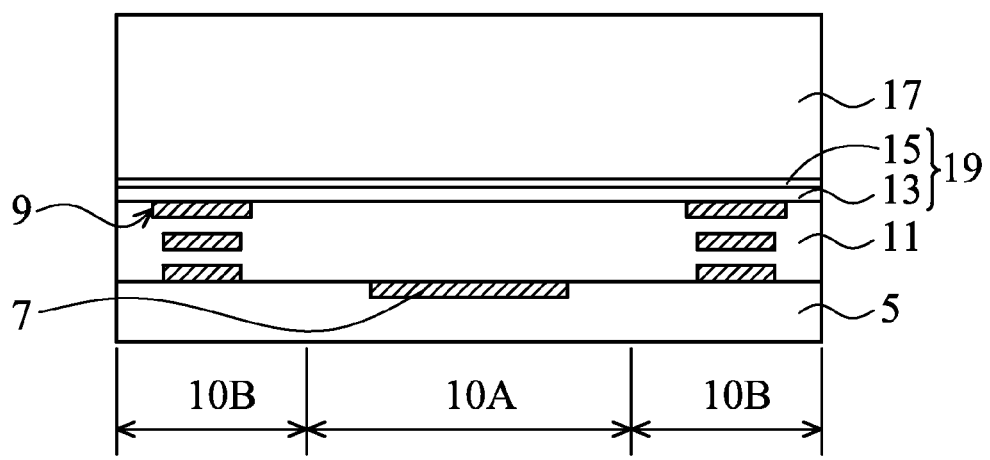

Referring to FIG. 9, in one embodiment the front surface 100A of the wafer 1 is bonded to a carrier wafer 17 to form a bonding surface, wherein the wafer 1 and the carrier wafer may be bonded together through a bonding layer 15, depending on the bonding techniques. Thus, in one embodiment, the bonding surface between the conducting pad structure 9 on the front surface 100A and the carrier wafer 17 includes an intermediate layer 19 such as the chip passivation layer 13 and/or the bonding layer 15. A thinning process may be next applied to the back surface 100B of the wafer 1 such that light can enter the image sensing region from the back surface.

Figure 10:
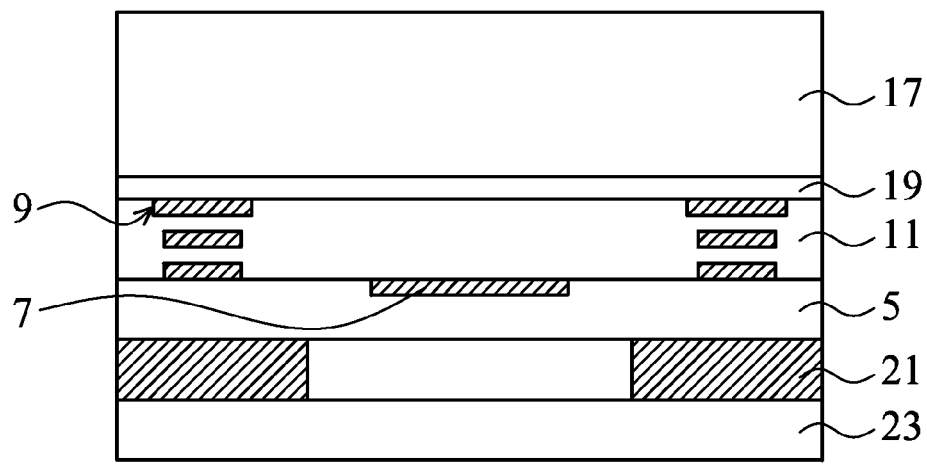

Referring to FIG. 10, in the next process step, another carrier wafer 23 is attached on the back surface 100B of the substrate 5 of the wafer, which may be, for example, a wafer composed of a transparent material such as glass. A spacer layer 21 may be formed between the substrate 5 and the carrier wafer 23. In one embodiment, a cavity may be formed on the active region of the substrate 5 and between the carrier wafer 23 and the spacer layer 21. Another thinning process may be performed to reduce a thickness of the carrier wafer 17.

Figure 11:
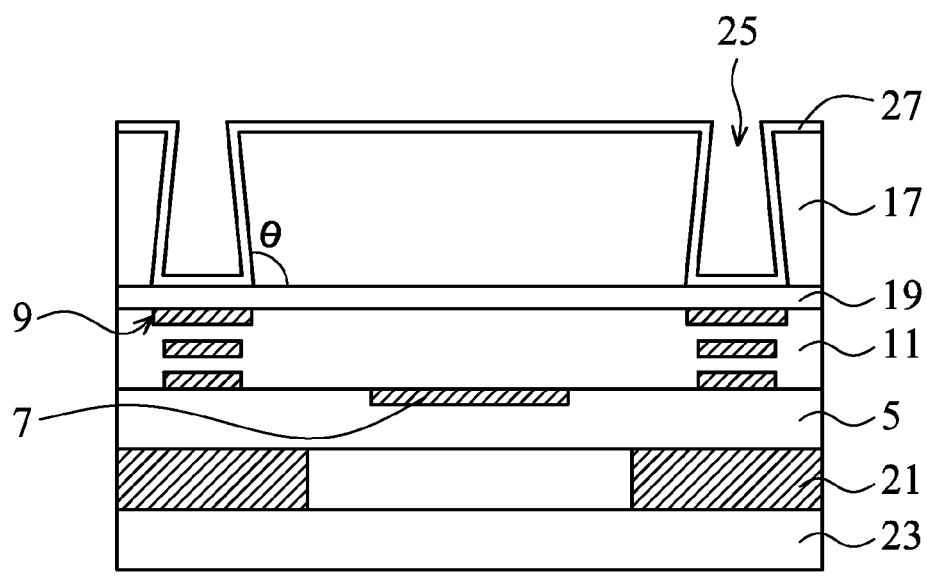

Referring to FIG. 11, a through hole 25 is subsequently formed in locations in the carrier wafer corresponding to the conducting pad structures. In this embodiment, the through hole is chosen to be formed with a conical or pyramidical profile with a steep sidewall, wherein the angle θ is between about 90° and 92°. Then, an insulating layer 27, such as an oxide layer, a light sensitive insulating layer, or a photoresist is conformally formed such that the insulating layer extends from the carrier wafer 17 to an inner sidewall and a bottom of the through hole 25.

Figure 12:
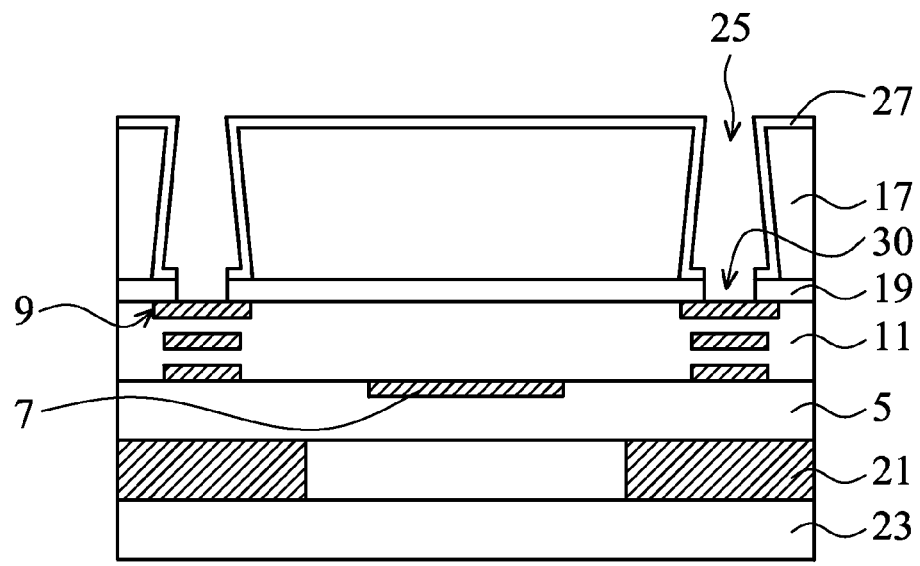

Referring to FIG. 12, a process step where the conducting pad structure 9 is exposed is performed to form an opening 30 at the bottom of the through hole 25. In this embodiment, the opening may penetrate a bonding surface, such as the intermediate layer 19, between two wafers. The depth of the opening may stop at an upper surface of the conducting pad structure and/or partially penetrate the conducting pad to reach the dielectric layer 11. Alternatively, the depth of the opening may further partially or completely penetrate the substrate 5 and stop at the spacer layer 21. The process steps and the structure mentioned above will be illustrated in detail in the following description.

Figure 13:
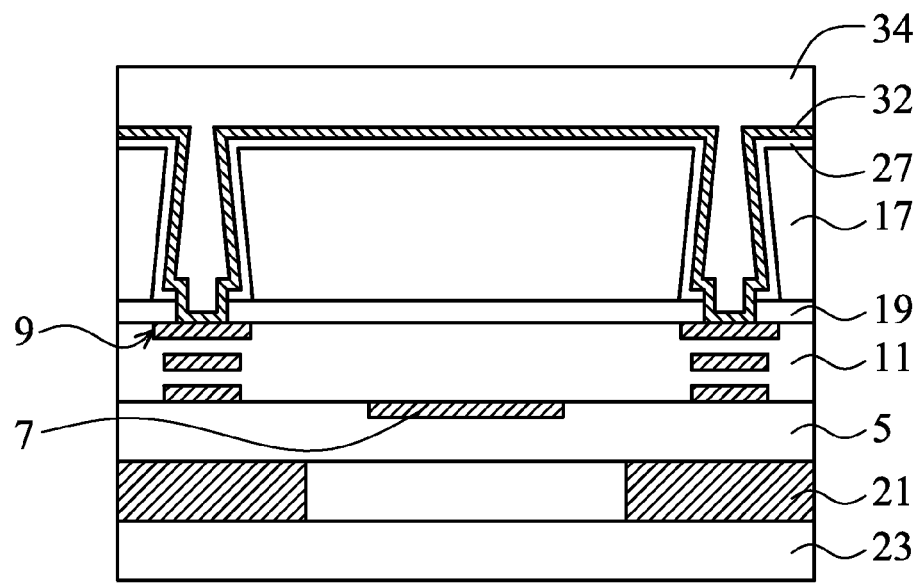

Referring to FIG. 13, a conducting layer 32 formed of, for example, a metal material is conformally formed on the surface of the carrier wafer 17. The conducting layer extends into the sidewall and the bottom of the through hole and the opening 30 to contact the conducting pad structure to form a conducting route. Then, a passivation layer 34 formed of, for example, a solder mask material is filled therein. Then, external connecting elements such as pads electrically connecting to the conducting layer 32 are fabricated and a wafer dicing process is performed to finish the fabrication of the chip package (not shown).

Figure 14A:
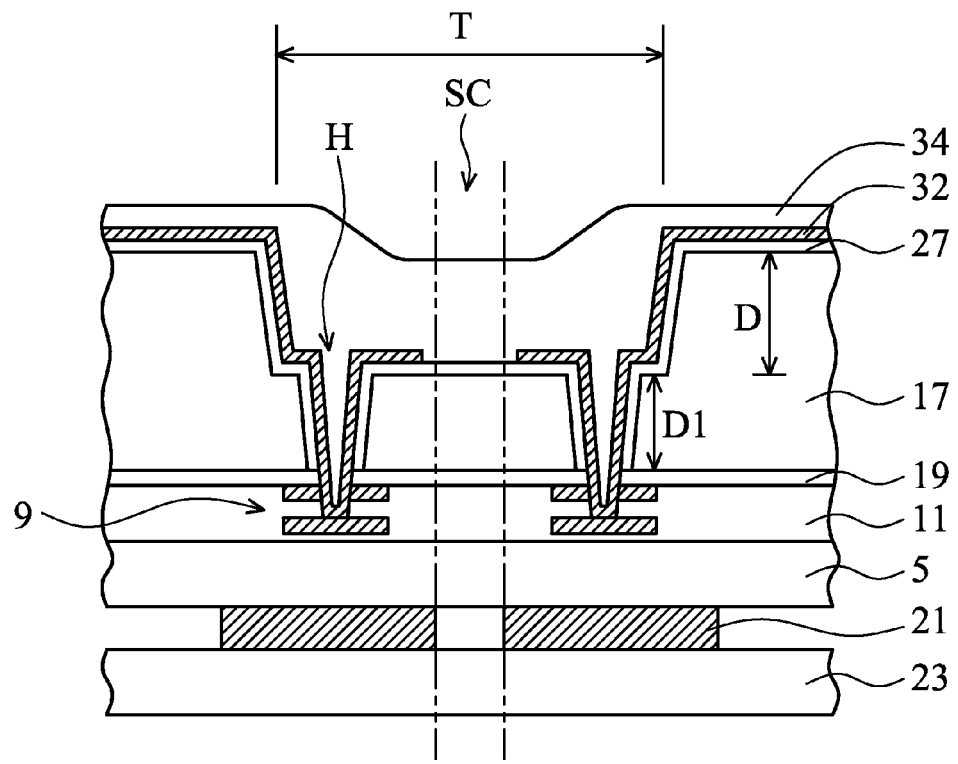
FIGS. 14A-14B are cross-sectional views showing the steps of forming a chip package according to another embodiment of the present invention.
Figure 14B:
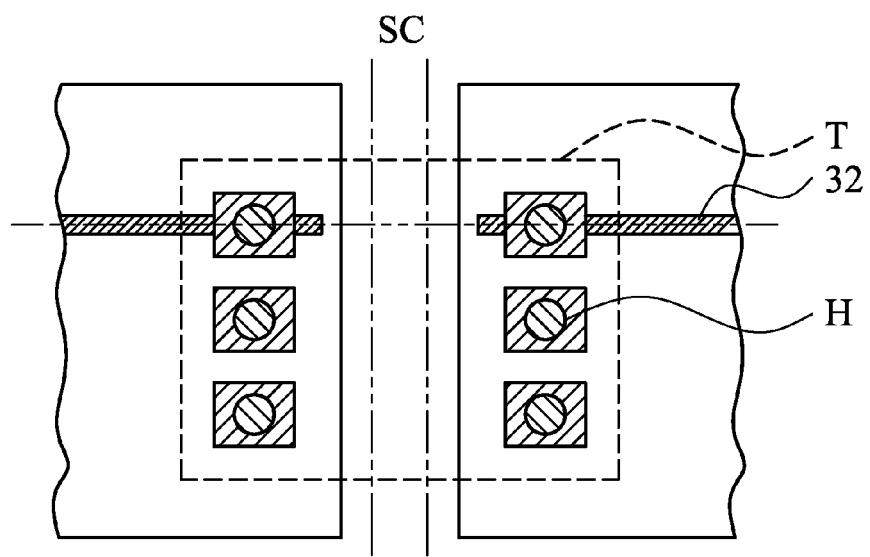

In another embodiment, as shown in FIGS. 14A and 14B, a cross-sectional view and a top view of another through hole structure are shown. In this embodiment, a process step such as an etching process is performed to the surface of the carrier wafer 17 to remove a portion of the material of the substrate such that a trench T having a predetermined depth D is formed. In the case that the carrier wafer 17 is a blank wafer, because no circuit element is formed therein, the opening, the location, or the depth of the trench T has more variations. The trench T may be formed on a location including a scribe line SC. Meanwhile, the range of the trench T may correspond to a plurality of conducting pad structures 9. For example, the range of the trench includes a whole sideline region. Then, a process step such as an etching process is performed to the bottom of the trench to remove a portion of the substrate material to form a plurality of through holes H each having a predetermined depth D1. Note that because the trench T can significantly reduce an aspect ratio of the through hole H, the difficulty of the process step of forming the opening 30 at the bottom of the through hole H can be reduced.

Hereafter, the manufacturing process of the opening 30 and the stacked structure of the conducting pad structures 9 (multilayer conducting pads) are illustrated.

Figure 15A:
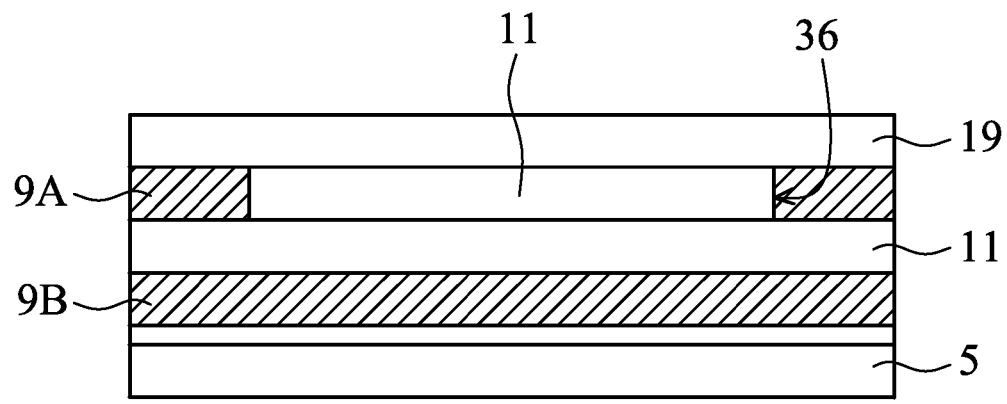
FIGS. 15A-15C are enlarged cross-sectional views showing the steps of forming a chip package according to an embodiment of the present invention.

Referring to FIG. 15A, an enlarged cross-sectional view showing the area of the opening 30 and the conducting pad 9 of the embodiment shown in FIG. 12 or FIG. 14A is shown. Multilayer conducting pads 9A and 9B, interlayer dielectric layers 11, and a bonding surface such as an intermediate layer 19 are formed on the substrate 5. In one embodiment, a pattern of the upper conducting pad 9A is designed such that a portion of the lower conducting pad 9B is exposed. In one embodiment, the upper conducting pad 9A has at least an insulating window 36. The insulating window 36 corresponds to the conducting pad 9B directly thereunder. That is, an opening, a recess, or a trench is simultaneously defined during the fabrication process of the upper conducting pad 9A, which is filled with the interlayer dielectric layer 11. In this embodiment, the insulating window 36 overlaps with a portion of the lower conducting pad 9B. The insulating window 36 is formed before the formation of the through hole or the bonding of the carrier wafer 17.

Figure 15B:
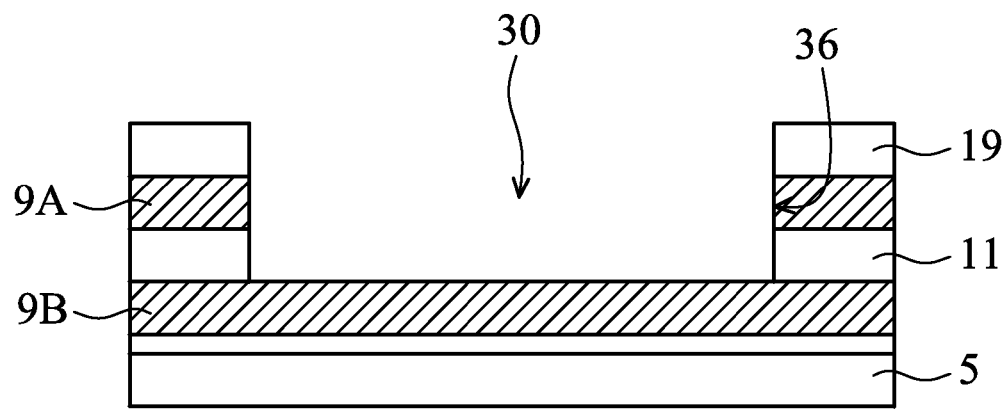

Then, with reference made to FIG. 14A, after the through hole H and the insulating layer 27 are formed in the substrate of the carrier wafer 17, a portion of the insulating layer 27 on the bottom of the through hole H is removed to form the opening 30, wherein this process step may be simultaneously or successively performed with the following process step. As shown in FIG. 15B, the process step includes removing the intermediate layer 19 to form the insulating window 36, and a portion of the interlayer dielectric layer 11 to expose a sidewall of the upper conducting pad 9A and a surface of the lower conducting pad 9B. For example, a suitable etching process including a photolithography process and an etching process may be chosen to accomplish the fabrication process mentioned above since the etching selectivity for the insulating layer and the metal are different.

Figure 15C:
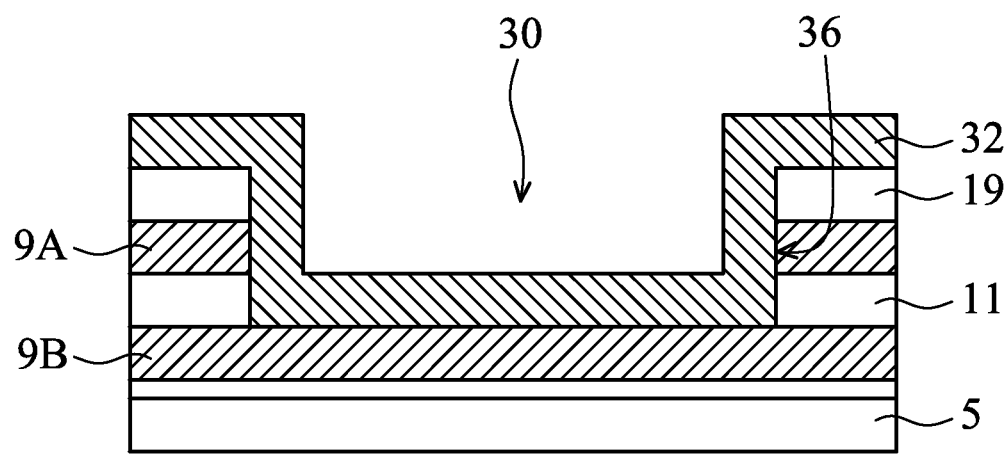

Then, as shown in FIG. 15C, the conducting layer 32 is formed to electrically connect one or multiple layers of the conducting pad structure. For example, the conducting pad 32 may simultaneously contact with the sidewall of the upper conducting pad and/or the upper surface of the lower conducting pad.

Figure 16A:
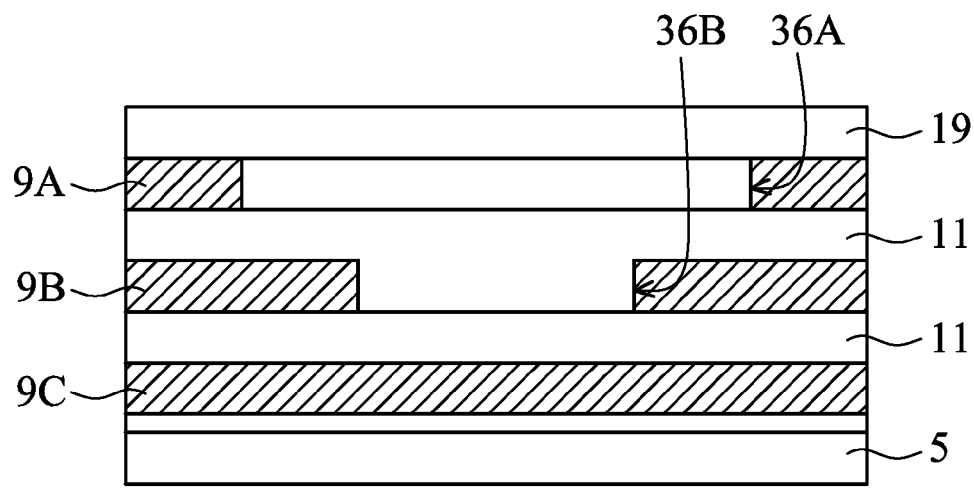
FIGS. 16A-16C are enlarged cross-sectional views showing the steps of forming a chip package according to an embodiment of the present invention.
Figure 16B:
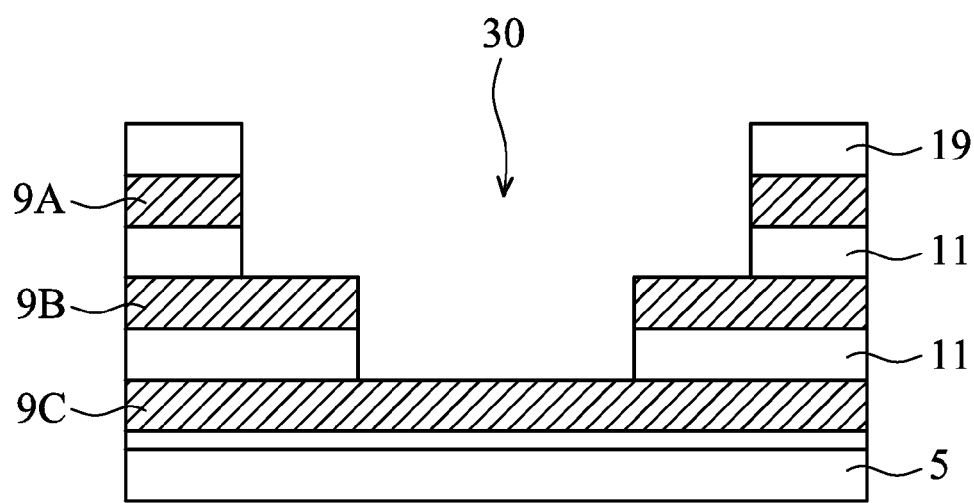
Figure 16C:
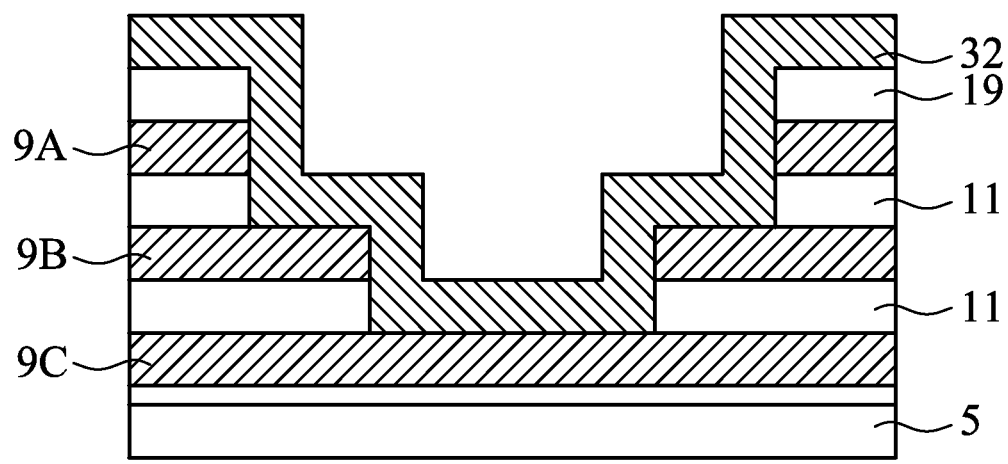

Referring to FIGS. 16A-16C, cross-sectional views showing the steps of forming a stacked structure of three conducting pads are illustrated, which includes an upper conducting pad 9A on an insulating window 36A, an intermediate conducting pad 9B having an insulating window 36B, and a lower conducting pad 9C, wherein the insulating window 36A is larger than the insulating window 36B, and both the two insulating windows correspond to an upper surface of the lower conducting pad 9C. In this embodiment, as shown in FIG. 16C, the formed conducting layer 32 may be electrically connected to one or multiple layers of the conducting pad structure. For example, the conducting layer 32 may simultaneously contact with a sidewall of the upper conducting pad 9A, an upper surface and a sidewall of the intermediate conducting pad 9B, and/or an upper surface of the lower conducting pad 9C.

Figure 17A:
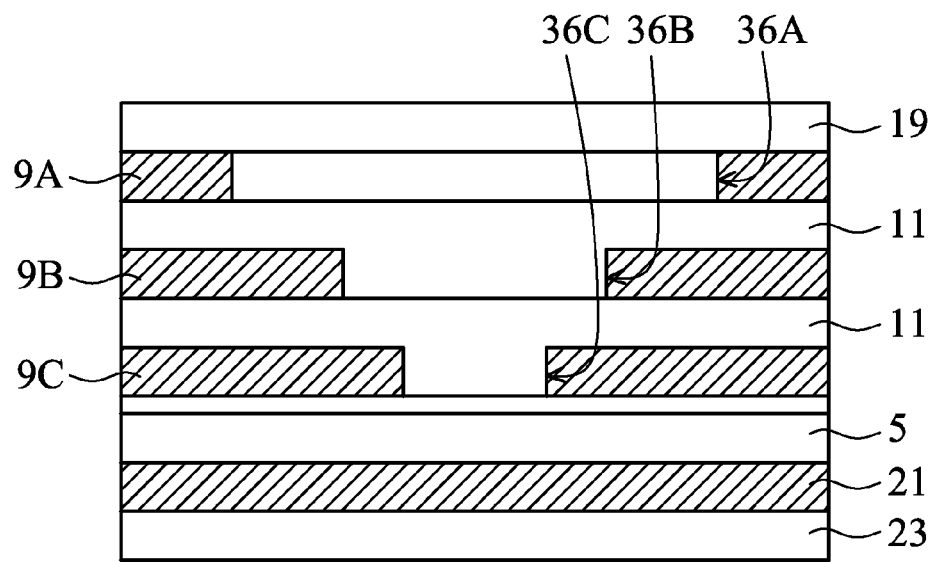
FIGS. 17A-17C are cross-sectional views showing the steps of forming a chip package according to an embodiment of the present invention.
Figure 17B:
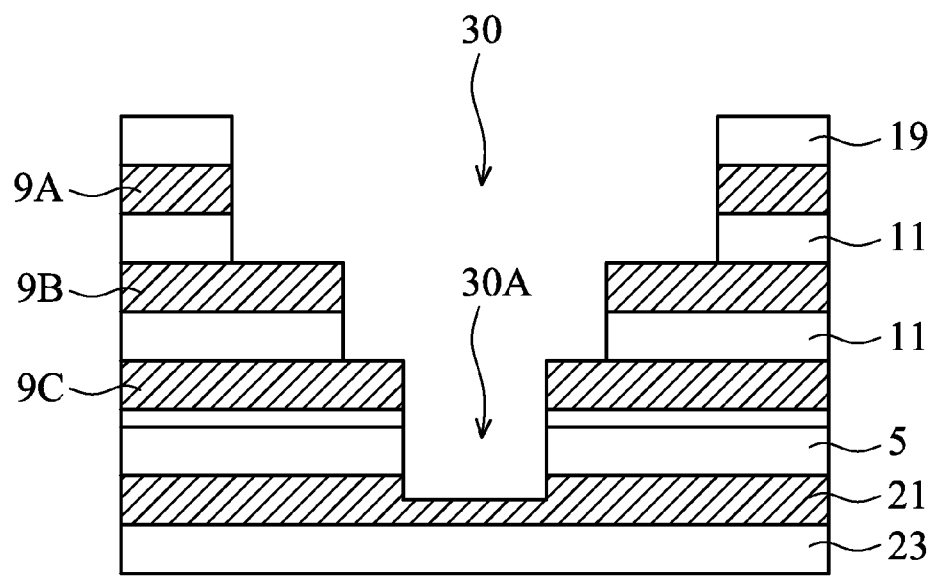
Figure 17C:
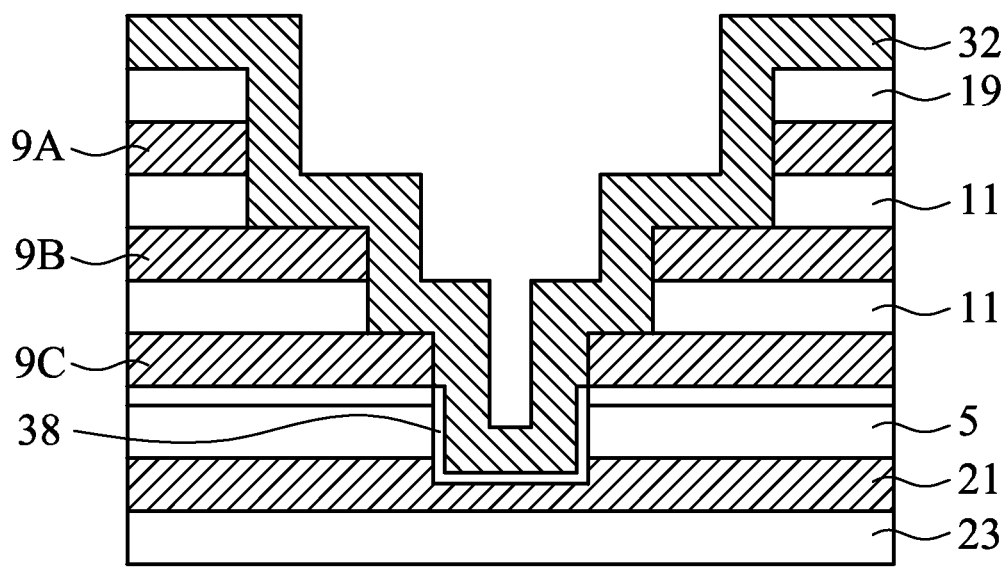

Next, referring to FIGS. 17A-17C, cross-sectional views showing the steps of forming a stacked structure of three conducting pads are illustrated. The difference between the embodiment and the embodiment mentioned above is that the lower conducting pad 9C also includes an insulating window 36C which has a corresponding relationship with the insulating window 36A of the upper conducting pad 9A and the insulating window 36B of the intermediate conducting pad 9B. Note that the insulating window 36C of the lower conducting pad 9C is smaller than the insulating windows 36A and 36B.

The step of forming the opening 30 includes removing the intermediate layer 19, the insulating windows 36A, 36B, and 36C, and a portion of the interlayer dielectric layer 11 to expose the sidewalls and a portion of the upper surface of the multilayer conducting pads. For example, a suitable etching process including a photolithography process and an etching process may be chosen to accomplish the fabrication process mentioned above since the selectivity for the insulating layer and the metal are different. Therefore, a contact area between the subsequently formed conducting layer 32 and the stacked structure of the conducting pads may be increased and the conducting layer 32 may be conformally formed.

According to required characteristics, the spacer layer 21 may also be chosen as a blocking layer. A portion of the silicon substrate 5 is further removed to form an opening 30A. The opening 30A may be located in the silicon substrate 5 or expose the spacer layer 21. Then, as shown in FIG. 17C, a conducting layer 32 is formed to electrically connect to one layer or multiple layers of the conducting pad structure. Alternatively, the conducting layer may simultaneously contact with a sidewall and/or an upper surface of the conducting pad. The conducting layer 32 may extend from the opening 30A to the silicon substrate 5. In one embodiment, before the conducting layer 32 is formed, another insulating layer 38 may be formed in the opening 30A. Alternatively, an oxidation process may be performed to form an oxide layer on the silicon substrate 5 in the opening 30A.

Figure 18A:
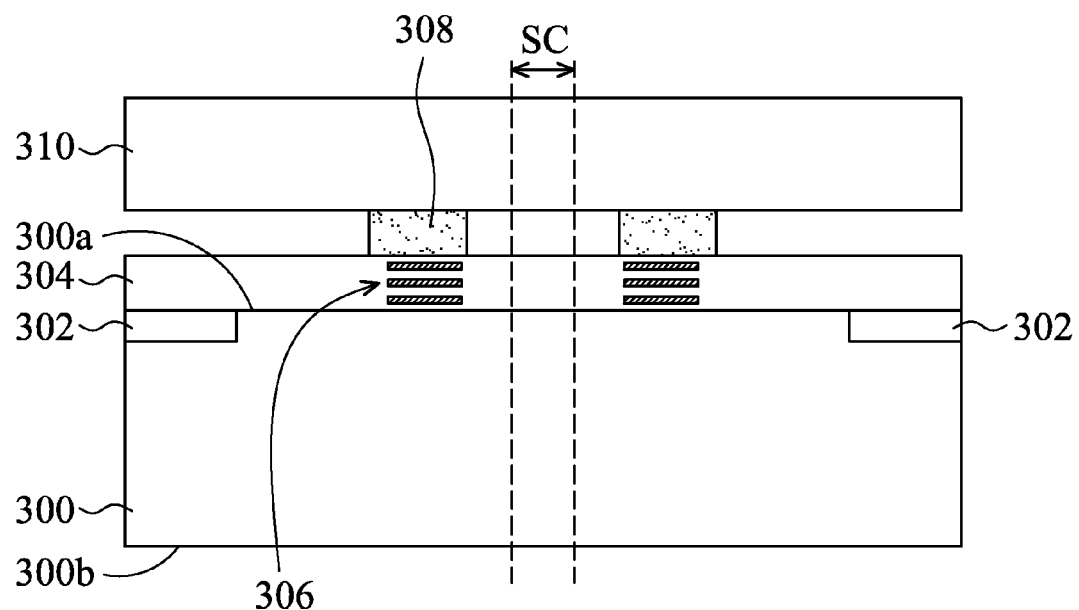
FIGS. 18A-18G are cross-sectional views showing the steps of forming a chip package according to an embodiment of the present invention.

FIGS. 18A-18G are cross-sectional views showing the steps of forming a chip package according to an embodiment of the present invention. As shown in FIG. 18A, a substrate 300 is provided, which has a surface 300a and a surface 300b. The substrate 300 may be, for example, a semiconductor wafer such as a silicon wafer. In one embodiment, a plurality of predetermined scribe lines SC may be defined in the substrate 300 which divide the substrate 300 into a plurality of regions. In each of the regions, at least a device region 302 is formed. In one embodiment, the device region 302 may include an optoelectronic device such as an image sensor device or a light emitting device. A plurality of conducting pad structures 306 are formed on the surface 300a of the substrate 300, which are located in an insulating layer 304 (or dielectric layer) on the surface 300a. Each of the conducting pad structures 306 may include a plurality of conducting pads which are stacked with each other. The stacked conducting pads may be electrically connected to each other (through, for example, vertical conducting structures between the stacked conducting pads). Alternatively, the stacked conducting pads may be electrically insulated from each other. In one embodiment, at least one of the conducting pads is electrically connected to the device region 302. It should be appreciated that thicknesses of the insulating layer 304 and the conducting pad structures 306 are actually thinner. For clarity, the thicknesses of the insulating layer 304 and the conducting pad structure 306 in the drawings are enlarged and do not correspond to actual size ratios.

Then, a carrier substrate 310 is disposed on the substrate 300. A plurality of spacer layers 308 may be disposed between the carrier substrate 310 and the substrate 300. The spacer layers 308 and the carrier substrate 310 may surround a plurality of cavities on the substrate 300, wherein there may be at least a device region 302 located under each of the cavities. The spacer layer 308 may cover the conducting pad structure 306. In the embodiment where the device region 302 includes an optoelectronic device (such as an image sensor device or a light emitting device), a transparent substrate (such as a glass substrate, quartz substrate, or transparent polymer substrate) may be chosen to serve as the carrier substrate 310 for facilitating light when entering the device region 302 or when being emitted from the device region 302.

Figure 18B:
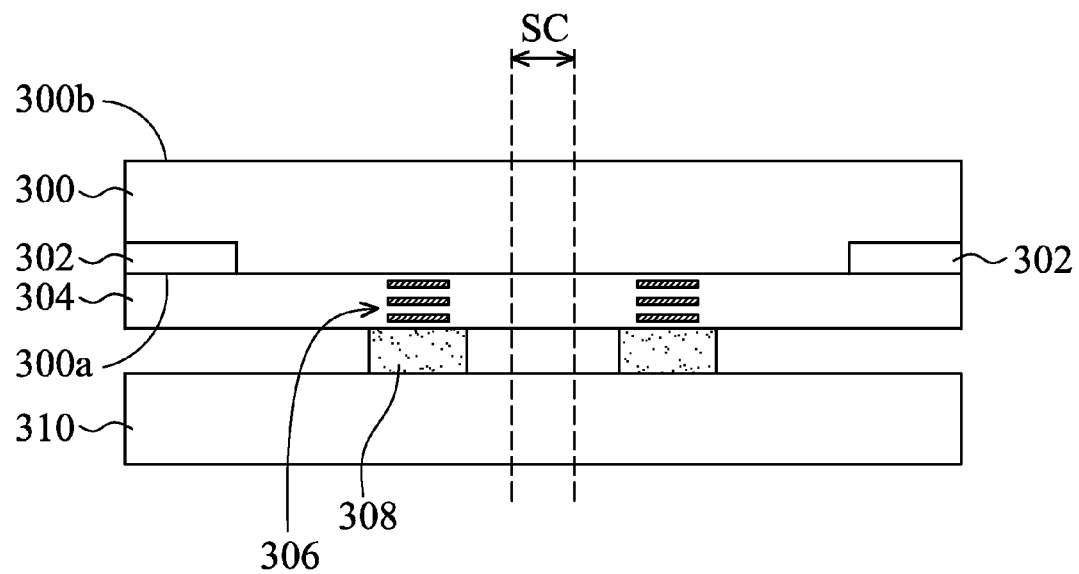

As shown in FIG. 18B, the substrate 300 may then be optionally thinned to facilitate subsequent processes. For example, the carrier substrate 310 may be used as a support, and the substrate 300 may be thinned from the surface 300b of the substrate 300. A suitable thinning process may include, for example, a mechanical grinding, chemical mechanical polishing, or etching process.

Figure 18C:
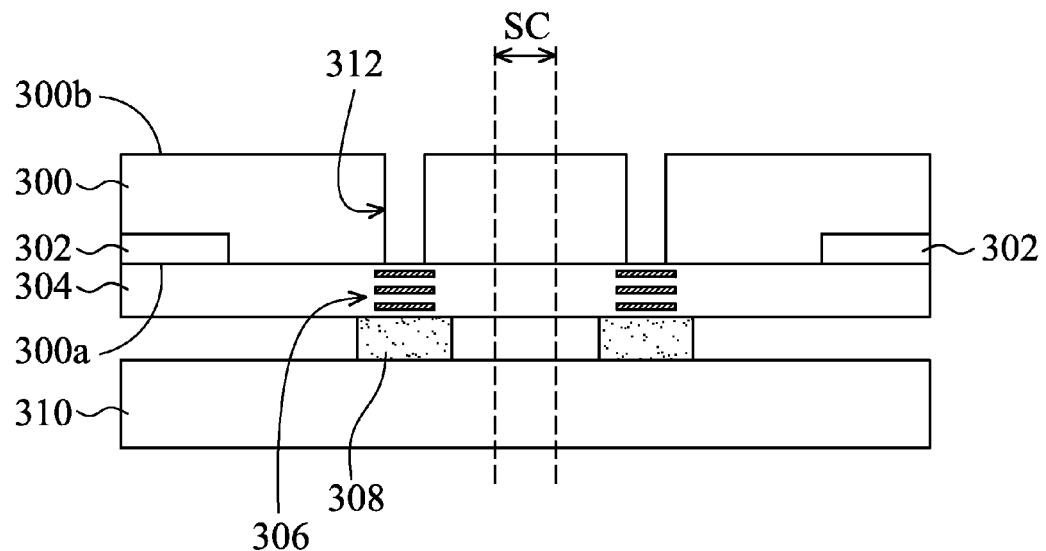

Next, as shown in FIG. 18C, a portion of the substrate 300 is removed to form a hole 312 extending from the surface 300b of the substrate 300 towards the conducting pad structure 306. For example, a photolithography process and an etching process may be applied to form the hole 312. In one embodiment, a sidewall of the hole 312 is substantially perpendicular to the surface 300b of the substrate 300.

Figure 18D:
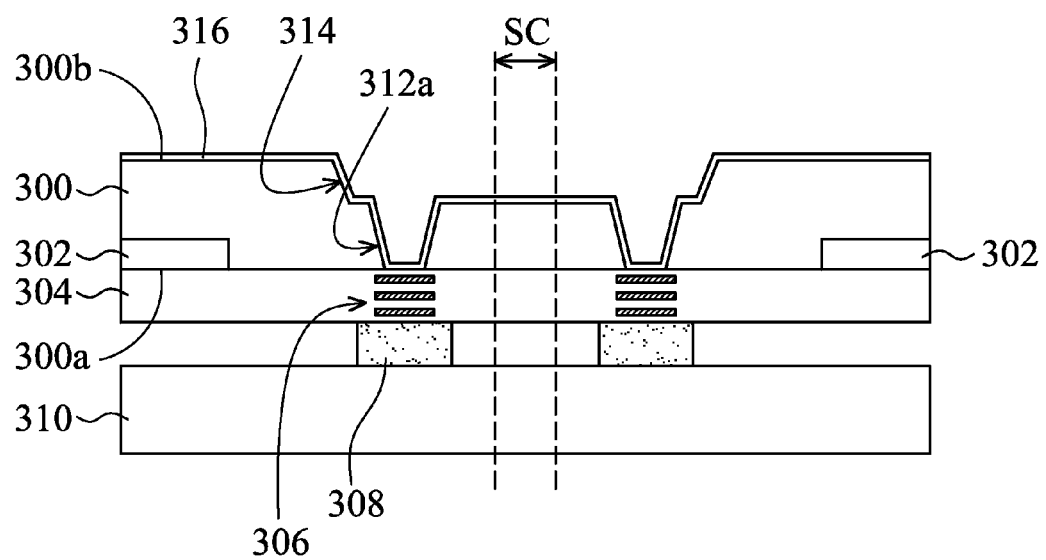

As shown in FIG. 18D, a portion of the substrate 300 is then removed to form a recess 314 extending from the surface 300b towards the surface 300a of the substrate 300. In one embodiment, the recess 314 may be formed by using, for example, a photolithography process and an etching process. The recess 314 may overlap with a plurality of holes 312. For example, the recess 314 may overlap with the holes 312 located in different regions beside the scribe line SC. The recess 314 may also overlap with the adjacent holes 312 located in a same region defined by the scribe lines SC. For example, the relationship between the recess 314 and the holes 312 may be similar to that shown in FIG. 14B.

In one embodiment, because the recess 314 is formed after the formation of the hole 312, an etching gas or an etching solution enters the hole 312 and partially removes the substrate 300 during the formation of the recess 314. Thus, in one embodiment, after the recess 314 is formed, the hole 312 is enlarged and in FIG. 18D, is denoted by the reference number "312a". The sidewall of the hole 312a inclines to the surface 300b of the substrate 300. Alternatively, the sidewall of the hole 312a inclines to the bottom of the recess 314. In one embodiment, the width of the hole 312a increases along a direction towards the surface 300b.

Then, an insulating layer 316 may be formed on the surface 300b of the substrate 300. A material of the insulating layer 316 may be, for example, an oxide, nitride, oxynitride, polymer material, or combinations thereof. The insulating layer 316 may be formed by vapor deposition, thermal oxidation, or coating. In one embodiment, the insulating layer 316 is substantially and conformally located on the surface 300b of the substrate 300, the sidewall of the recess 314, and the sidewall and the bottom of the hole 312a.

Figure 18E:
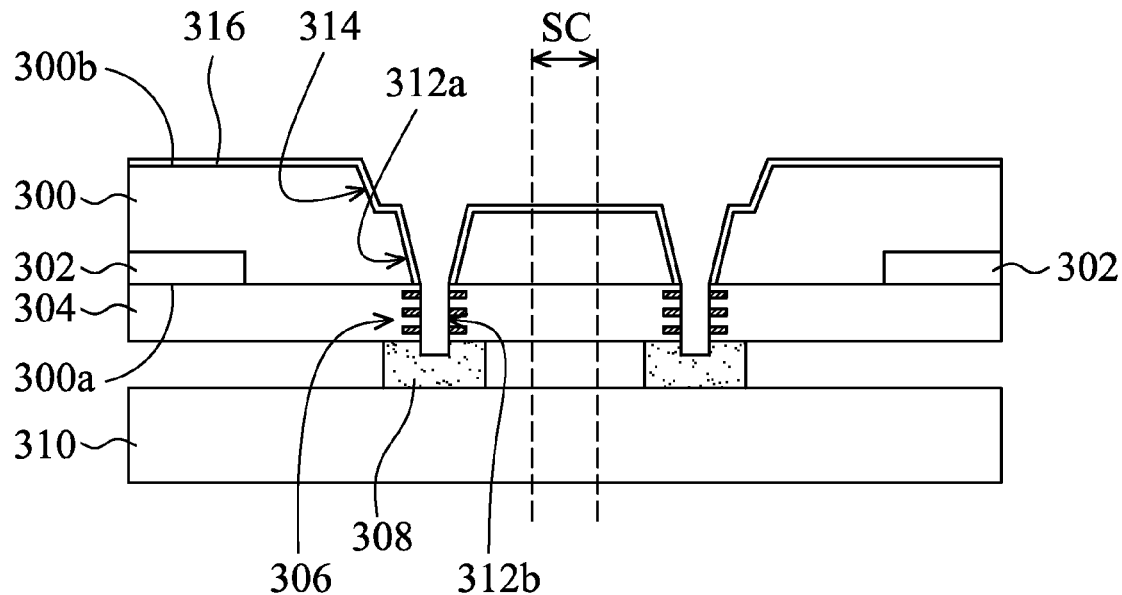

Next, as shown in FIG. 18E, a portion of the insulating layer 316 on the bottom of the hole 312a is removed, and a hole 312b is then formed. In one embodiment, a portion of the insulating layer 304, a portion of the conducting pad structure 306, and a portion of the spacer layer 308 may be removed by using, for example, a photolithography process and an etching process to form the hole 312b. In another embodiment, each of the conducting pads in the conducting pad structure 306 has already been patterned to have openings exposing the conducting pads thereunder. In this case, only the insulating layer 304 needs to be etched during the formation of the hole 312b, wherein no conducting pad needs to be etched.

Figure 18F:
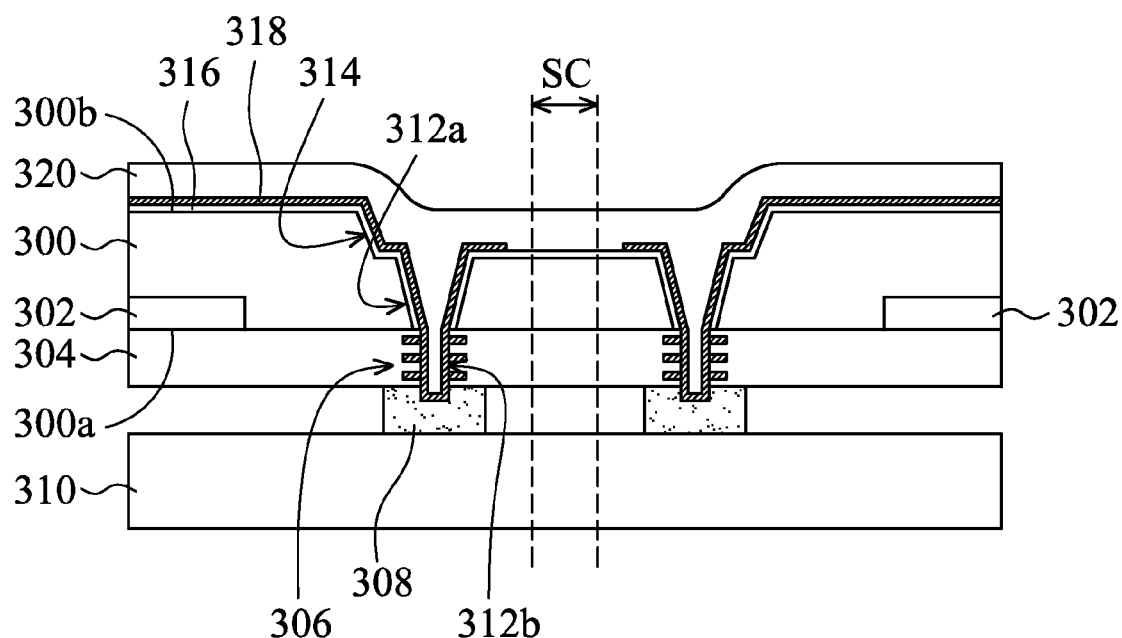

As shown in FIG. 18F, a patterned conducting layer 318 is then formed on the surface 300b of the substrate 300. A material of the conducting layer 318 may include, for example, copper, aluminum, nickel, gold, platinum, or combinations thereof. The conducting layer 318 may be formed by, for example, physical vapor deposition, chemical vapor deposition, coating, electroplating, electroless plating, or combinations thereof.

The conducting layer 318 may extend from the surface 300b of the substrate 300 towards the conducting pad structure 316, along the sidewall of the recess 314, the sidewall of the hole 312a, and the sidewall of the hole 312b, to electrically contact with the conducting pad structure 316.

It should be appreciated that although in the embodiment shown in FIG. 18F, the conducting layer 318 electrically contacts with three conducting pads and penetrates through the insulating layer 304 to enter the spacer layer 308 and directly contact with the spacer layer 308, the embodiments of the present invention are not limited thereto. The hole 312b of the embodiments of the invention is not limited to be extending into the spacer layer 308. According to the embodiments of the invention, the conducting layer 318 and the conducting pad structure 306 may also have a structure similar to that shown in FIG. 2C, 3C, or 4B. In addition, the conducting pad structure 306 may also have many variations. For example, the conducting pad structure 306 may have a structure similar to one of those shown in FIGS. 6A-6E.

Still referring to FIG. 18F, a solder mask layer 320 may then be formed on the surface 300b of the substrate 300. In one embodiment, the solder mask 320 may have an opening (not shown) exposing the conducting layer 318, and a conducting structure (not shown) such as a solder ball may be formed on the exposed conducting layer 318. In one embodiment, because the recess 314 and the holes (312a and 312b) have inclined sidewalls, the material used for forming the solder mask layer 320 may be filled into the hole more easily. In one embodiment, the solder mask layer 320 substantially and completely fills the recess 314 and the holes (312a and 312b) such that there is substantially no void or air bubble formed in the solder mask layer 320.

Figure 18G:
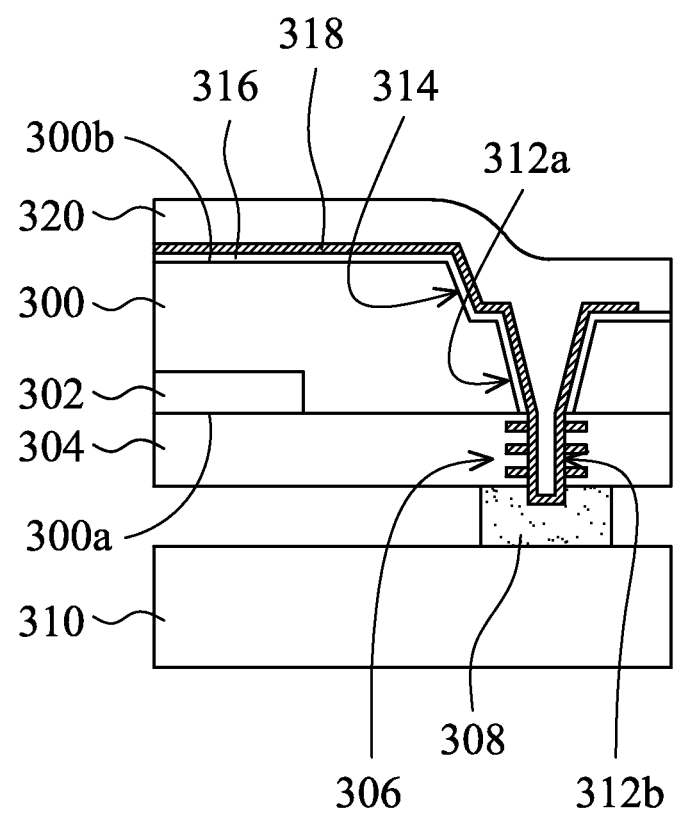

Next, the structure shown in FIG. 18F is diced along the predetermined scribe lines SC to form a plurality of separate chip packages, as shown in FIG. 18G.

Figure 19A:
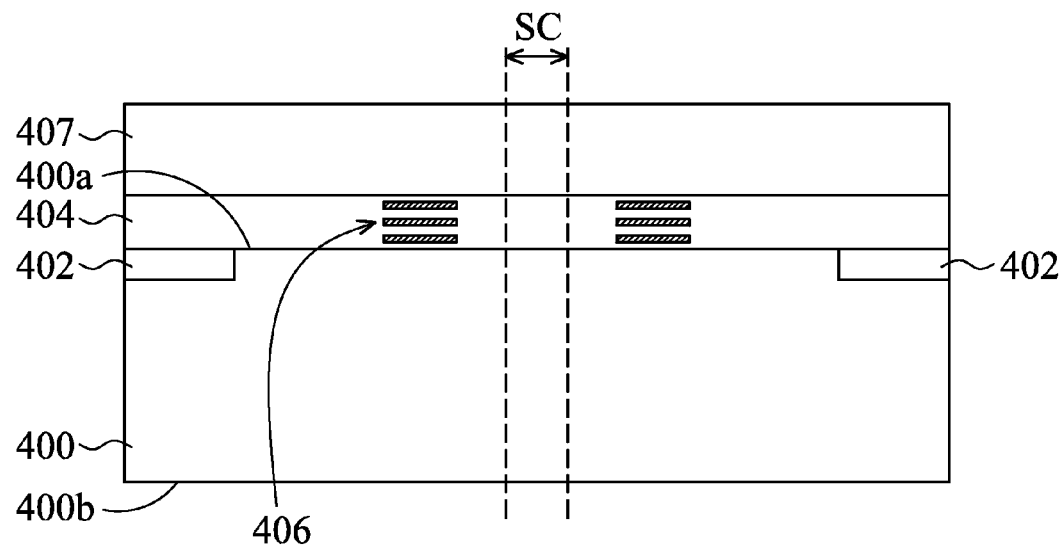
FIGS. 19A-19F are cross-sectional views showing the steps of forming a chip package according to an embodiment of the present invention.

FIGS. 19A-19F are cross-sectional views showing the steps of forming a chip package according to an embodiment of the present invention. As shown in FIG. 19A, a substrate 400 is provided, which has a surface 400a and a surface 400b. The substrate 400 may be, for example, a semiconductor wafer such as a silicon wafer. In one embodiment, a plurality of predetermined scribe lines SC may be defined in the substrate 400 which divide the substrate 400 into a plurality of regions. In each of the regions, at least a device region 402 is formed. In one embodiment, the device region 402 may include an optoelectronic device such as an image sensor device or a light emitting device. A plurality of conducting pad structures 406 are formed on the surface 400a of the substrate 400, which are located in an insulating layer 404 (or dielectric layer) on the surface 400a. Each of the conducting pad structures 406 may include a plurality of conducting pads which are stacked with each other. The stacked conducting pads may be electrically connected to each other (through, for example, vertical conducting structures between the stacked conducting pads). Alternatively, the stacked conducting pads may be electrically insulated from each other. In one embodiment, at least one of the conducting pads is electrically connected to the device region 402. It should be appreciated that thicknesses of the insulating layer 404 and the conducting pad structures 406 are actually thinner. For clarity, the thicknesses of the insulating layer 404 and the conducting pad structure 406 in the drawings are enlarged and do not correspond to actual size ratios.

Then, a carrier substrate 407 is disposed on the surface 400a of the substrate 400. The carrier substrate 407 is fixed on the insulating layer 404 on the substrate 400 through an adhesion layer (not shown) or bonding of another type. In one embodiment, a size and a shape of the carrier substrate 407 are substantially the same as those of the substrate 400 thereunder. In one embodiment, the carrier substrate 407 is a semiconductor wafer such as a silicon wafer.

Figure 19B:
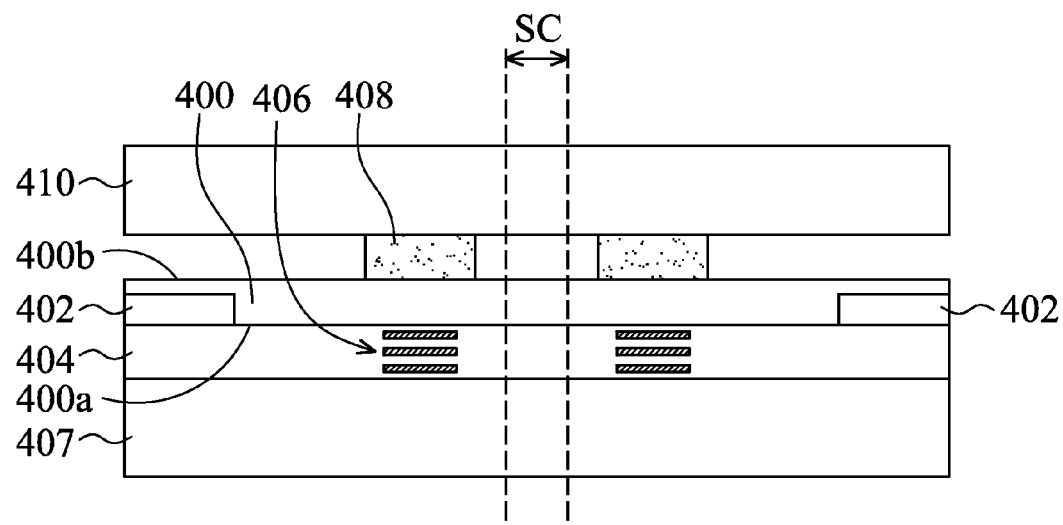

As shown in FIG. 19B, the carrier substrate 407 may be used as a support, and the substrate 400 is thinned from the surface 400b of the substrate 400. A suitable thinning process may include, for example, a mechanical grinding, chemical mechanical polishing, or etching process.

Then, another carrier substrate 410 is disposed on the substrate 400. A plurality of spacer layers 408 may be disposed between the carrier substrate 410 and the substrate 400. The spacer layers 408 and the carrier substrate 410 may surround a plurality of cavities on the substrate 400, wherein there may be at least a device region 402 located under each of the cavities. The spacer layer 408 may cover the conducting pad structure 406. In the embodiment where the device region 402 includes an optoelectronic device (such as an image sensor device or a light emitting device), a transparent substrate (such as a glass substrate, quartz substrate, or transparent polymer substrate) may be chosen to serve as the carrier substrate 410 for facilitating light when entering the device region 402 or when being emitted from the device region 402. In addition, because the substrate 400 has been thinned, light only needs to penetrate the carrier substrate 410 (transparent substrate) and the thinned substrate 400 without penetrating the insulating layer 404 and the conducting pad structure 406 when light enters or is emitted from the device region 402. Thus, the transmission of light becomes more efficient.

Figure 19C:
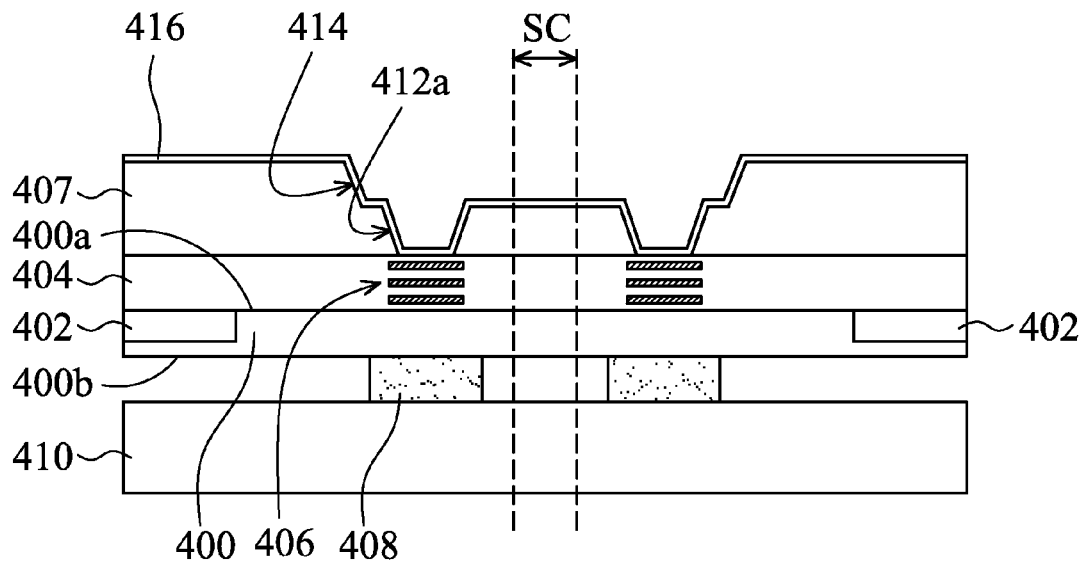

Next, as shown in FIG. 19C, in one embodiment, the carrier substrate 410 may then be used as a support, and a portion of the carrier substrate 407 is removed from an upper surface of the carrier substrate 407 (by using, for example, a photolithography process and an etching process) to form a hole extending from the upper surface of the carrier substrate 407 towards the conducting pad structure 406. In one embodiment, a sidewall of the formed hole (not shown) is substantially perpendicular to the upper surface of the carrier substrate 407.

Next, a portion of the carrier substrate 407 is removed to form a recess 414 extending from the upper surface of the carrier substrate 407 towards the substrate 400. In one embodiment, the recess 414 may be formed by using, for example, a photolithography process and an etching process. The recess 414 may overlap with a plurality of holes. For example, the recess 414 may overlap with the holes located in different regions beside the scribe line SC. The recess 414 may also overlap with the adjacent holes located in a same region defined by the scribe lines SC. For example, the relationship between the recess 414 and the holes may be similar to that shown in FIG. 14B.

In one embodiment, because the recess 414 is formed after the formation of the holes mentioned above, an etching gas or an etching solution enters the holes and partially removes the substrate 400 during the formation of the recess 414. Thus, in one embodiment, after the recess 414 is formed, the hole is enlarged and in FIG. 19C, it is denoted by the reference number "412a". The sidewall of the hole 412a inclines to the upper surface of the carrier substrate 407. Alternatively, the sidewall of the hole 412a inclines to the bottom of the recess 414. In one embodiment, the width of the hole 412a increases along a direction towards the upper surface of the carrier substrate 407.

Then, an insulating layer 416 may be formed on the upper surface of the carrier substrate 407. A material of the insulating layer 416 may be, for example, an oxide, nitride, oxynitride, polymer material, or combinations thereof. The insulating layer 416 may be formed by vapor deposition, thermal oxidation, or coating. In one embodiment, the insulating layer 416 is substantially and conformally located on the upper surface of the carrier substrate 407, the sidewall of the recess 414, and the sidewall and the bottom of the hole 412a.

Figure 19D:
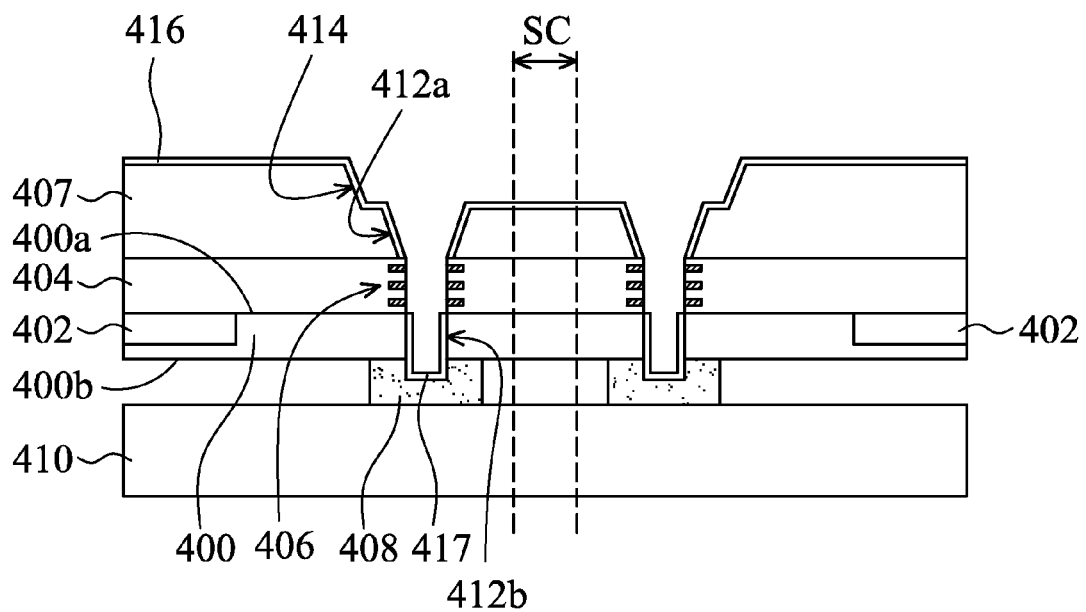

Next, as shown in FIG. 19D, a portion of the insulating layer 416 on the bottom of the hole 412a is removed, and a hole 412b is then formed. In one embodiment, a portion of the insulating layer 404, a portion of the conducting pad structure 406, and a portion of the spacer layer 408 may be removed by using, for example, a photolithography process and an etching process to form the hole 412b. In another embodiment, each of the conducting pads in the conducting pad structure 406 has already been patterned to have openings exposing the conducting pads thereunder. In this case, only the insulating layer 404 needs to be etched during the formation of the hole 412b, wherein no conducting pad needs to be etched.

As shown in FIG. 19D, in one embodiment, a patterned insulating layer 417 may be optionally formed on the bottom and a portion of the sidewall of the hole 412b. The insulating layer 417 covers the substrate 400 originally exposed in the hole 412b. The insulating layer 417 does not cover the conducting pad structure 406.

Figure 19E:
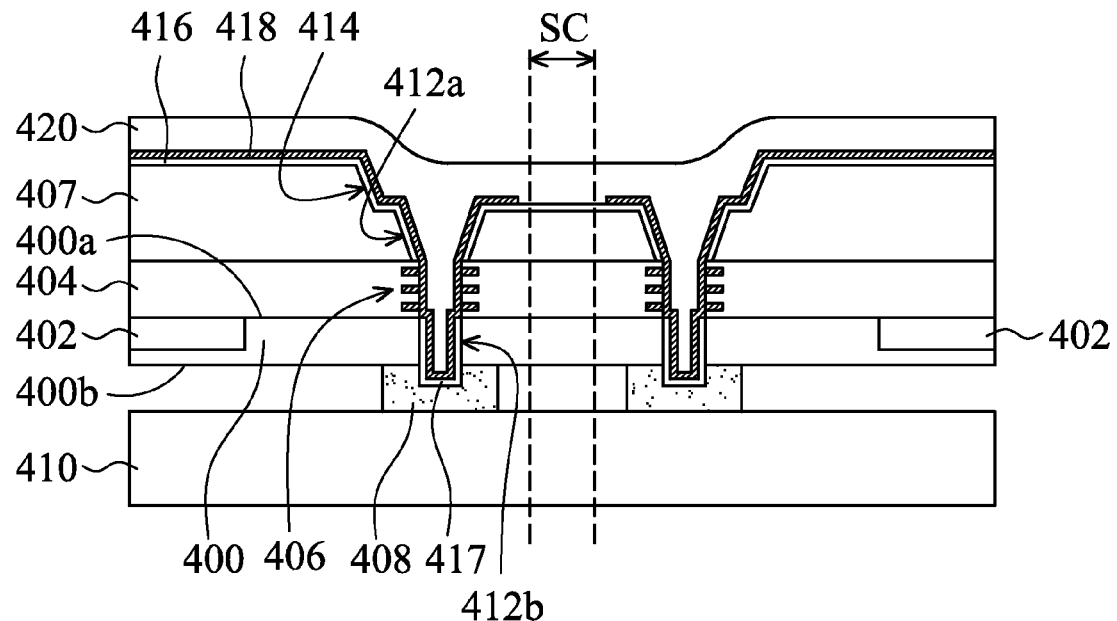

Next, as shown in FIG. 19E, a patterned conducting layer 418 is formed on the upper surface of the carrier substrate 407. A material of the conducting layer 418 may include, for example, copper, aluminum, nickel, gold, platinum, or combinations thereof. The conducting layer 418 may be formed by, for example, physical vapor deposition, chemical vapor deposition, coating, electroplating, electroless plating, or combinations thereof.

The conducting layer 418 may extend from the upper surface of the carrier substrate 407 towards the conducting pad structure 416, along the sidewall of the recess 414, the sidewall of the hole 412a, and the sidewall of the hole 412b, to electrically contact with the conducting pad structure 416.

It should be appreciated that although in the embodiment shown in FIG. 19E, the conducting layer 418 electrically contacts with three conducting pads and penetrates through the insulating layer 404 to enter the spacer layer 408 and directly contact with the spacer layer 408, the embodiments of the present invention are not limited thereto. The hole 412b of the embodiments of the invention is not limited to be extending into the spacer layer 408. According to the embodiments of the invention, the conducting layer 418 and the conducting pad structure 406 may also have a structure similar to that shown in FIG. 2C, 3C, or 4B. In addition, the conducting pad structure 406 may also have many variations. For example, the conducting pad structure 406 may have a structure similar to one of those shown in FIGS. 6A-6E.

Still referring to FIG. 19E, a solder mask layer 420 may then be formed on the upper surface of the carrier substrate 407. In one embodiment, the solder mask 420 may have an opening (not shown) exposing the conducting layer 418, and a conducting structure (not shown) such as a solder ball may be formed on the exposed conducting layer 418. In one embodiment, because the recess 414 and the holes (412a and 412b) have inclined sidewalls, the material used for forming the solder mask layer 420 may be filled into the hole more easily. In one embodiment, the solder mask layer 420 substantially and completely fills the recess 414 and the holes (412a and 412b) such that there is substantially no void or air bubble formed in the solder mask layer 420.

Figure 19F:
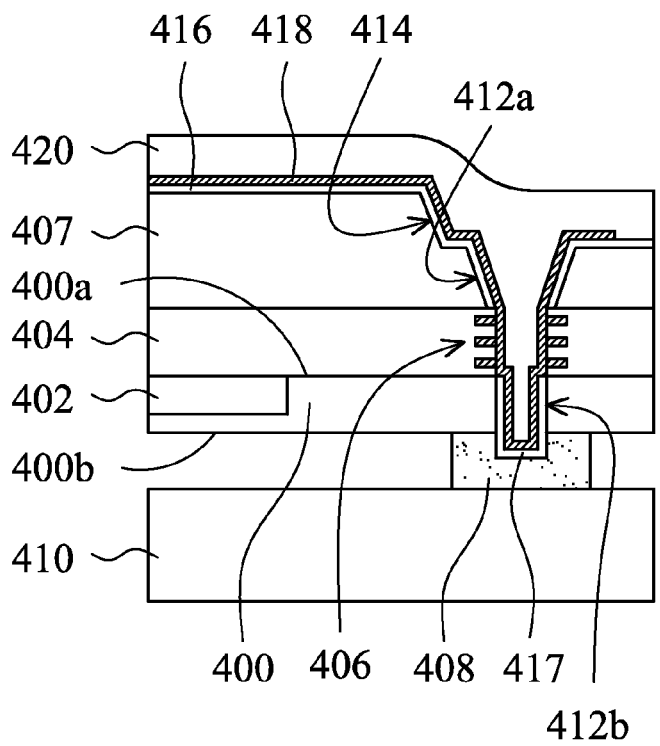

Next, the structure shown in FIG. 19E is diced along the predetermined scribe lines SC to form a plurality of separate chip packages, as shown in FIG. 19F.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a substrate having an upper surface and a lower surface, wherein the substrate comprises:
a plurality of conducting pads located below the lower surface of the substrate; and
a dielectric layer located between the conducting pads;
removing a portion of the substrate from the upper surface of the substrate to form a hole extending towards the conducting pads;
after the hole is formed, removing a portion of the substrate from the upper surface of the substrate to form a trench extending towards the lower surface of the substrate, wherein the trench connects with the hole;
forming an insulating layer on a sidewall of the trench and a sidewall and a bottom of the hole;
removing a portion of the insulating layer and a portion of the dielectric layer to expose a portion of the conducting pads; and
forming a conducting layer on the sidewall of the trench and the sidewall and the bottom of the hole, wherein the conducting layer electrically contacts with the conducting pads.

2. The method for forming a chip package as claimed in claim 1, wherein the sidewall of the hole inclines to the lower surface of the substrate after the trench is formed.

3. The method for forming a chip package as claimed in claim 2, wherein the sidewall of the hole is substantially perpendicular to the lower surface of the substrate before the trench is formed.

4. The method for forming a chip package as claimed in claim 1, wherein an upper conducting pad of the conducting pads has at least an opening or a trench, wherein the opening or the trench exposes a lower conducting pad of the conducting pads.

5. The method for forming a chip package as claimed in claim 1, wherein a thickness of at least one of the conducting pads near the hole increases along a direction away from the hole.

6. The method for forming a chip package as claimed in claim 1, wherein the bottom of the hole exposes an upper surface of at least one of the conducting pads.

7. The method for forming a chip package as claimed in claim 1, wherein the lower sidewall of the hole exposes a side of at least one of the conducting pads.

8. The method for forming a chip package as claimed in claim 1, further comprising forming a spacer layer under the conducting pads, wherein the hole further extends into the spacer layer.

9. The method for forming a chip package as claimed in claim 1, further comprising forming a transparent substrate under the spacer layer.

10. The method for forming a chip package as claimed in claim 1, further comprising filling a solder mask layer in the hole.

11. A method for forming a chip package, comprising:
providing a substrate having a first surface and a second surface, wherein the substrate comprises:
a plurality of conducting pads located on the first surface of the substrate; and
a dielectric layer located between the conducting pads;
disposing a carrier substrate on the conducting pads and the dielectric layer on the first surface of the substrate;
removing a portion of the carrier substrate from an upper surface of the carrier substrate to form a hole extending towards the conducting pads;
after the hole is formed, removing a portion of the carrier substrate from the upper surface of the carrier substrate to form a trench extending towards the substrate, wherein the trench connects with the hole;
forming an insulating layer on the sidewall of the trench and the sidewall and the bottom of the hole;
removing a portion of the insulating layer and a portion of the dielectric layer to expose a portion of the conducting pads; and
forming a conducting layer on the sidewall of the trench and the sidewall and the bottom of the hole, wherein the conducting layer electrically contacts with the conducting pads.

12. The method for forming a chip package as claimed in claim 11, wherein the hole extends into the substrate, and the conducting layer extends into the substrate.

13. The method for forming a chip package as claimed in claim 12, further comprising forming a second insulating layer between the substrate and the conducting layer.

14. The method for forming a chip package as claimed in claim 11, wherein an upper conducting pad of the conducting pads has at least an opening or a trench, wherein the opening or the trench exposes a lower conducting pad of the conducting pads.

15. The method for forming a chip package as claimed in claim 11, wherein a thickness of at least one of the conducting pads near the hole increases along a direction away from the hole.

16. The method for forming a chip package as claimed in claim 11, wherein the bottom of the hole exposes an upper surface of at least one of the conducting pads.

17. The method for forming a chip package as claimed in claim 11, wherein the lower sidewall of the hole exposes a side of at least one of the conducting pads.

18. The method for forming a chip package as claimed in claim 11, further comprising forming a spacer layer under the conducting pads, wherein the hole further extends into the spacer layer.

19. The method for forming a chip package as claimed in claim 11, further comprising filling a solder mask layer in the hole.

20. The method for forming a chip package as claimed in claim 11, wherein the sidewall of the hole inclines to the lower surface of the substrate after the trench is formed, and wherein the sidewall of the hole is substantially perpendicular to the lower surface of the substrate before the trench is formed.

* * * * *